United States Patent [19]
Tanida et al.

[11] Patent Number: 5,574,691
[45] Date of Patent: Nov. 12, 1996

[54] SEMICONDUCTOR MEMORY DEVICE HAVING CIRCUIT FOR ACTIVATING PREDETERMINED ROWS OF MEMORY CELLS UPON DETECTION OF DISTURB REFRESH TEST

[75] Inventors: Susumu Tanida; Kazutoshi Hirayama; Tomio Suzuki; Masanori Hayashikoshi, all of Hyogo, Japan

[73] Assignee: Mitsubishi Denki Kabushiki Kaisha, Tokyo, Japan

[21] Appl. No.: 408,255

[22] Filed: Mar. 22, 1995

Related U.S. Application Data

[62] Division of Ser. No. 304,028, Sep. 9, 1994.

[30] Foreign Application Priority Data

Oct. 1, 1993 [JP] Japan ................................. 5-246942
Apr. 22, 1994 [JP] Japan ................................. 6-084622

[51] Int. Cl.⁶ ......................................................... G11C 7/00
[52] U.S. Cl. ............................................. 365/201; 365/149
[58] Field of Search ............................... 365/201, 230.03, 365/230.04, 222, 149

[56] References Cited

U.S. PATENT DOCUMENTS

| | | | |
|---|---|---|---|
| 4,774,061 | 5/1988 | Takemae et al. | 365/201 |
| 4,906,994 | 3/1990 | Hoffman et al. | 365/201 |
| 5,109,382 | 4/1992 | Fukunaka | 365/201 |
| 5,212,442 | 5/1993 | O'Toole | 365/201 |
| 5,305,267 | 4/1994 | Haraguchi et al. | 365/201 |
| 5,339,273 | 8/1994 | Taguchi | 365/201 |
| 5,355,342 | 10/1994 | Ueoka | 365/201 |

*Primary Examiner*—A. Zarabian
*Attorney, Agent, or Firm*—Lowe, Price, LeBlanc & Becker

[57] ABSTRACT

When a disturb refresh mode is detected by a mode detecting circuit, a row decoder control circuit simultaneously activates every several word lines of a memory cell array of a block selected by an operation block selecting circuit through a row decoder and a driving circuit, reads out data written in a normal mode, and determines a memory cell having a threshold value lower than that of a design value upon determination of match of read data and written data.

11 Claims, 30 Drawing Sheets

(a) $\overline{WE}$
(b) DATA
(c) I/O
(d) $\overline{I/O}$

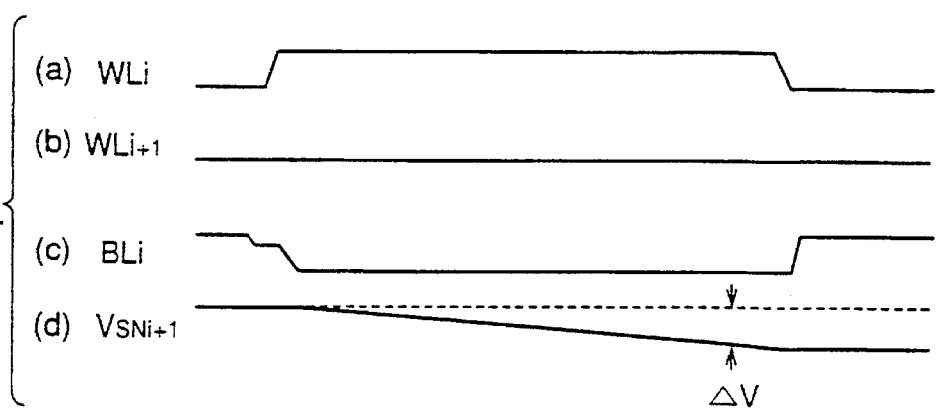

SEMICONDUCTOR MEMORY DEVICE HAVING CIRCUIT FOR ACTIVATING PREDETERMINED ROWS OF MEMORY CELLS UPON DETECTION OF DISTURB REFRESH TEST

This application is a division of application Ser. No. 08/304,028 filed Sep. 9, 1994.

BACKGROUND OF THE INVENTION

1. Field of the Invention

The present invention generally relates to semiconductor memory devices. More particularly, the present invention relates to a semiconductor memory device which can be operated in a test mode for finding a defect of a memory cell configured of a transistor and a capacitor in a dynamic random access memory (hereinafter referred to as a "DRAM").

2. Description of the Background Art

FIG. 31 is a block diagram showing a conventional semiconductor memory device including a plurality of memory blocks. In FIG. 31, to an input terminal 1, input is an address signal, which is applied to an operation block selecting circuit 2, a column address buffer 3, and a row address buffer 4. Operation block selecting circuit 2 provides a block select signal for selecting any memory block. More specifically, the semiconductor memory device is divided into a plurality of memory blocks 11, 12, ..., 1n, any memory block of which is selected by the block select signal from operation block selecting circuit 2. Memory block 11 includes a column decoder 111, an I/O gate 112, an input/output circuit 113, a row decoder 114, a driving circuit 115, and a memory cell array 116. Other memory blocks 12, ..., 1n are configured of the similar components.

Operation block selecting circuit 2 activates column decoder 111 and row decoder 114 when selecting memory block 11, for example. Column address buffer 3 provides an input column address signal to column decoders 111, 121, ..., 1n1. Row address buffer 4 provides an input row address signal to row decoders 114, 124, ..., 1n4. Row decoder 114 activates a word line in response to activation of the block select signal of memory block 11 and the row address signal. Then, column decoder 111 designates a column address in response to activation of the block select signal and the column address signal. Data applied through I/O gate 112 from input/output circuit 113 is written in a memory cell of the designated address. Data amplified by a sense amplifier is read out from the memory cell of the designated address, and the data is provided outside from I/O gate 112 through input/output circuit 113.

FIG. 32 is a block diagram showing one example of the row decoder shown in FIG. 31. In FIG. 32, the row decoder includes an inverter 201 inverting the row address signal, and an NAND circuit 202 receiving the row address signal and the inverted row address signal for providing a word line activation signal Xi.

FIG. 33 is a diagram showing one example of the memory cell array shown in FIG. 31. In FIG. 33, the memory cell array includes word lines WL1, WL2, WL3 and bit line pairs BL1, $\overline{BL1}$, BL2, $\overline{BL2}$ orthogonal thereto. Transistors Q1 to Q6 and capacitors C1 to C6 configuring memory cells are connected to respective crossings of the word lines and the bit line pairs. To bit line pairs BL1, $\overline{BL1}$, BL2, $\overline{BL2}$, connected are sense amplifier and equalizers 301, 302 for equalizing and precharging the corresponding bit line pair to ½ Vcc before data is read out from a memory cell and amplifying a small potential difference after the data is read out.

FIG. 34 is a circuit diagram for explaining operation of transmission of data read out from the memory cell to an I/O line. A row decode signal Xi from row decoder 114 shown in FIG. 32 is applied to a word line driving circuit 115. Word line driving circuit 115 drives a word line WLi in response to a word line drive signal ϕ. Data read out from memory cell array 116 configured of a memory cell transistor Qi and a capacitor Ci to a bit line pair BLi, $\overline{BLi}$ is amplified by a sense amplifier 303. Sense amplifier 303 includes n channel transistors 311, 312, and p channel transistors 313, 314. Sense amplifier 303 amplifies data read out from memory cell array 116 to the bit line pair BLi, $\overline{BLi}$ in response to sense amplifier drive signals $\overline{S2N}$, S2P. An equalize circuit 304 includes n channel transistors 315, 316 and 317. Equalize circuit 304 equalizes the bit line pair BLi, $\overline{BLi}$ by a constant voltage $V_{BL}$ (=½·Vcc) and a bit line equalize signal BLEQ. An I/O gate circuit 305 includes n channel transistors 318, 319 for transmitting a potential of the bit line pair BLi, $\overline{BLi}$ to an input/output line pair I/O, $\overline{I/O}$ in response to a column decode signal Yi. The input/output line pair I/O, $\overline{I/O}$ is pulled up to a level of Vcc-Vth by n channel transistors 320, 321.

FIG. 35 is a timing chart for explaining operation of the circuit of FIG. 34. Referring to FIG. 35, operation of the circuit of FIG. 34 will be described. When the row decode signal Xi attains a logical low level or an "L" level as shown in FIG. 35(a), and the word line drive signal ϕ attains a logical high level or an "H" level as shown in FIG. 35(b), the word line WLi is activated into an "H" level, as shown in FIG. 35(c). At this time, the equalize signal BLEQ is already brought into an "L" level, as shown in FIG. 35(d), and the bit line is already precharged to ½ Vcc. Data is read out to the bit line pair BLi, $\overline{BLi}$, causing a small potential difference between the bit line pair, as shown in FIG. 35(g), (h). As shown in FIG. 35(e), (f), when sense amplifier drive signals $\overline{S2N}$, S2P are activated, the potential difference between the bit line pair BLi, $\overline{BLi}$ is amplified by sense amplifier 303, as shown in FIG. 35(g), (h) to be a difference between Vcc and Vss levels. Then, the column decode signal Yi is brought into an "H" level as shown in FIG. 35(i). Data amplified by sense amplifier 303 is provided to the input/output line pair I/O, $\overline{I/O}$, as shown in FIG. 35(j), (k).

FIG. 36 is a diagram showing a part of the memory cell array shown in FIG. 33. In FIG. 36, memory cell transistors Qi, Qi+1 and memory cell capacitors Ci, Ci+1 are connected to respective crossings of the bit line $\overline{BLi}$ and word lines WLi, WLi+1. A constant voltage $V_{cp}$ (=½·Vcc) is applied to one electrode of memory cell capacitors Ci, Ci+1.

FIG. 37 is a timing chart showing operation in the case where information ("L" level) of the memory cell capacitor Ci connected to the word line WLi shown in FIG. 36 is read out. As shown in FIG. 37(a), when the word 20 line WLi attains an "H" level, the memory cell transistor Qi is turned on, and the information of an "L" level stored in the memory cell capacitor Ci is read out to the bit line $\overline{BLi}$ through the memory cell transistor Qi, as shown in FIG. 37(c), to be amplified by a sense amplifier, not shown.

When a threshold voltage $Vth_{i+1}$ of the memory cell transistor $Q_{i+1}$ adjacent to the memory cell transistor $Q_i$ is lower than a design value by any means, as shown in FIG. 37(c), information of an "H" level stored in the memory cell capacitor $C_{i+1}$ is gradually leaked to the bit line $\overline{BLi}$. When a 16 M-bit DRAM or the like is manufactured, for example, a threshold voltage of a memory cell transistor of several bits is lowered by adhesion of small dust or the like.

In order to exclude a semiconductor integrated circuit including such a memory cell transistor of several bits having a low threshold voltage, a test called disturb refresh test has conventionally been carried out. More specifically, assume that a threshold voltage $Vth_{+1}$ of the memory cell transistor $Q_{i+1}$ in FIG. 36 is low, for example. Data of an "L" level is written in the memory cell capacitor Ci, and data of an "H" level is written in the memory cell capacitor $C_{i+1}$. The data of the memory cell capacitor $C_i$ is repeatedly read out. Since the potential of the bit line $\overline{BLi}$ to which the memory cell transistor $Q_{i+1}$ is connected is at an "L" level, a drain-to-source voltage is generated in the memory cell transistor $Q_{i+1}$, causing a subthreshold current to flow. If the threshold voltage $Vth_{i+1}$ is low, the subthreshold current is large, and the data is lost. Therefore, data of the memory cell capacitor $C_{i+1}$ is read out, and match of the data with the written data is determined. If the data is not matched with the written data, it can be determined that the threshold voltage of the memory cell transistor $Q_{i+1}$ is lower than the design value.

When a disturb refresh test is carried out in the blocked DRAM shown in FIG. 31, memory block 11, for example, is selected by operation block selecting circuit 2, and predetermined identical data is written in all the memory cells in memory cell array 116. Then, data continuously activating one word line in memory cell array 116 and connected to a word line adjacent to the one word line is read out, and match of the data with the written data is determined. If they are not matched, it is determined that the threshold voltage of the transistor of the memory cell is lower than the design value. Then, read out is data of a memory cell activating a word line other than the above-described activated word line for a predetermined time and connected to a word line adjacent to the word line, and match of the data with the written data is determined. The operation is carried out for all the memory cells in memory cell array 116.

In a conventional disturb refresh test, word lines are only activated one by one. When a data hold time of cells other than a memory cell connected to a word line adjacent to a particular word line which is continuously activated for a predetermined time is checked, a data hold compensation time of a memory cell is substantially longer than a time required for reading and writing data from and to a cell in general. Therefore, a time required for the disturb refresh test is (the number of word lines)×(time required for activation of the word lines)×(the number of blocks which operate simultaneously), when represented without taking into consideration a time required for writing and reading data from and to a memory cell. For example, in the case of a 16 MDRAM, the number of word lines is 16384, a time required for activation of the word lines is 64 msec, and the number of blocks which operate simultaneously is 4. Therefore, a test time required is approximately 262 sec, resulting in a long test time.

SUMMARY OF THE INVENTION

A main object of the present invention is to provide a semiconductor memory device including a test circuit which can shorten a time required for a disturb refresh test.

Another object of the present invention is to provide a semiconductor memory device including a test mode circuit which can detect in a short time a memory cell leaking a small amount of current and shorten a time required for a test, by making the level of writing in the memory cell lower in a test mode than in a normal operation mode.

In one aspect of the present invention, a semiconductor memory device having a plurality of word lines, a plurality of bit lines crossing respective word lines, and a plurality of memory cell transistors each connected to one of the plurality of word lines and one of the plurality of bit lines, and incorporating a test circuit for determining in a test mode a memory cell transistor having a threshold voltage lower than a predetermined threshold voltage out of the plurality of memory cell transistors, includes a test mode detecting circuit for detecting the test mode, and an activating circuit for activating all the memory cell transistors of predetermined rows out of the plurality of memory cell transistors in response to detection of the test mode.

According to the present invention, by activating all the memory cells of predetermined rows in the test mode, data of the memory cells of the rows can be read out at one time to be compared with written data. As a result, it is possible to determine in a short time a memory cell transistor having a threshold voltage lower than a predetermined threshold voltage.

According to another aspect of the present invention, the semiconductor memory device, having a plurality of word lines divided into a plurality of blocks, includes a test mode detecting circuit for detecting a test mode, a block selecting circuit for selecting a designated block out of the plurality of blocks in a write/read mode for writing data or reading out written data to select the plurality of blocks at one time in response to detection of the test mode, and an activating circuit for activating memory cell transistors of predetermined rows at one time out of a plurality of memory cell transistors of the plurality of blocks selected at one time.

According to the present invention, when a plurality of memory cell blocks are provided, memory cells of predetermined rows of respective memory blocks are activated at one time. As a result, it is possible to determine a memory cell transistor having a low threshold voltage in a short time.

According to a further aspect of the present invention, the semiconductor memory device includes a test mode detecting circuit for detecting a test mode, and a negative potential signal generating circuit for applying a drive signal of a negative potential to a sense amplifier so that a memory cell transistor having a low threshold voltage is likely to be rendered conductive in response to detection of the test mode.

According to the present invention, a small signal is applied to a word line in response to detection of the test mode. The amplitude of the small signal changes in order to increase the potential of the word line. As a result, the memory cell transistor having a threshold voltage lower than a predetermined threshold voltage is likely to be rendered conductive, thereby making it possible to determine such a memory cell transistor in a short time.

According to a further aspect of the present invention, the semiconductor memory device includes a word line for test provided in parallel with a word line, crossing a plurality of bit lines, and coupled to each bit line through parasitic capacitance, a test mode detecting circuit for detecting a test mode, and a small signal generating circuit for applying a small signal having its amplitude changed to the word line for test in order to increase the potential thereof in response to detection of the test mode.

According to the present invention, a small signal having its amplitude changed is applied to the word line for test in order to increase the potential thereof in the test mode. As a result, it is possible to determine a memory cell transistor having a low threshold voltage in a short time.

According to a further aspect of the present invention, the semiconductor memory device includes a test mode detecting circuit for detecting a test mode, and a negative potential signal generating circuit for applying a drive signal of a negative potential to a sense amplifier so that a memory cell transistor having a low threshold voltage is likely to be rendered conductive in response to detection of the test mode.

According to the present invention, the drive signal of a negative potential is applied to the sense amplifier in response to detection of the test mode, so that a memory cell transistor having a low threshold voltage is likely to be rendered conductive. As a result, data held by such a memory cell transistor is rapidly leaked, thereby making it possible to determine a memory cell transistor having a low threshold voltage in a short time.

According to a further aspect of the present invention, the semiconductor memory device is controlled so that, in response to detection of a test mode, a potential level written in a memory cell capacitor becomes lower than the case of the normal operation.

According to the present invention, it is possible to detect a memory cell leaking a small amount of current in a short time and to shorten a test time, resulting in reduction of cost required for the test.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 37 is a timing chart showing operation in the case where information of a memory cell capacitor Ci connected to a word line WLi of FIG. 36 is read out.

DESCRIPTION OF THE PREFERRED EMBODIMENTS

Figure 1:
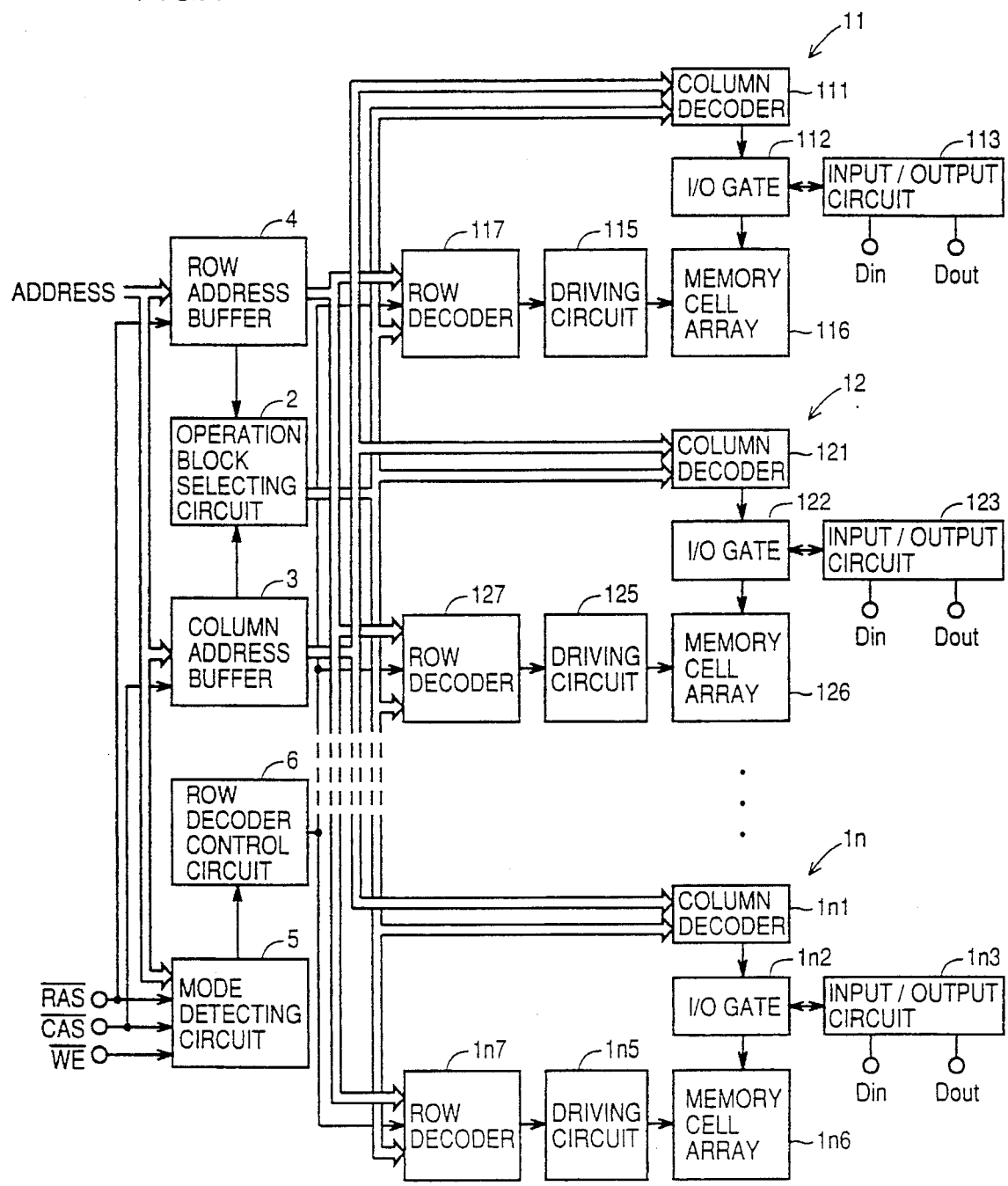
FIG. 1 is a block diagram showing the entire configuration of one embodiment of the present invention.

FIG. 1 is a block diagram showing the entire configuration of one embodiment of the present invention. In FIG. 1, the semiconductor memory device is configured similar to the conventional example of FIG. 19, except that a mode detecting circuit 5 for detecting a disturb refresh mode is further provided, and that a detect signal of the mode detecting circuit is applied to a row decoder control circuit 6. A row address strobe signal $\overline{RAS}$, a column address strobe signal CAS, a write enable signal $\overline{WE}$, and the 0th bit $A_0$ of an address signal are applied to mode detecting circuit 5. Row decoder control circuit 6 simultaneously activates every several word lines of memory cell arrays 116, 126, ..., 1n6 in response to detection of the disturb refresh mode by mode detecting circuit 5, shortening a time required for the disturb refresh test.

Figure 2:
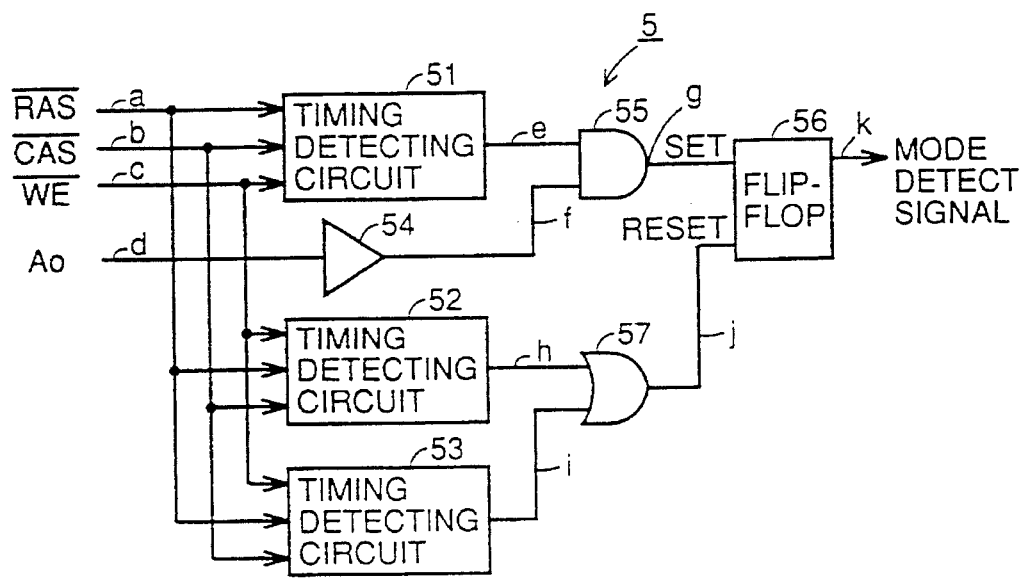
FIG. 2 is a specific block diagram of a mode detecting circuit shown in FIG. 1.

FIG. 2 is a specific block diagram of the mode detecting circuit shown in FIG. 1. In FIG. 2, the row address strobe signal $\overline{RAS}$, the column address strobe signal $\overline{CAS}$ and the write enable signal $\overline{WE}$ are all applied to timing detecting circuits 51, 52 and 53. Timing detecting circuit 51 is configured of an AND circuit. Timing detecting circuit 51 brings the write enable signal $\overline{WE}$ into an "L" level to cause the column address strobe signal $\overline{CAS}$ to fall to "L" level. Then, timing detecting circuit 51 senses a timing ($\overline{WE}$ $\overline{CAS}$ before $\overline{RAS}$ cycle) at which it causes the row address strobe signal $\overline{RAS}$ to fall to provide a signal of an "H" level. The output of timing detecting circuit 51 is applied to one input terminal of an AND circuit 55. The address signal $A_0$ is applied to the other input terminal of AND circuit 55 through a high threshold value buffer 54. High threshold value buffer 54 applies a signal of an "H" level to the other input terminal of AND circuit 55 if the address signal $A_0$ is at a predetermined voltage or more which is higher than an ordinary "H" level. AND circuit 55 sets a flip-flop 56 when two inputs attain an "H" level. Accordingly, flip-flop 56 provides a mode detect signal of an "H" level.

Timing detecting circuit 52 senses a timing (a timing of $\overline{RAS}$ only refresh) at which the row address strobe signal $\overline{RAS}$ falls to an "L" level with the column address strobe signal $\overline{CAS}$ in an "H" level. Timing detecting circuit 52 applies a second reset signal which attains an "H" level to flip-flop 56 through an OR circuit 57 to reset the mode detect signal.

Figure 3:
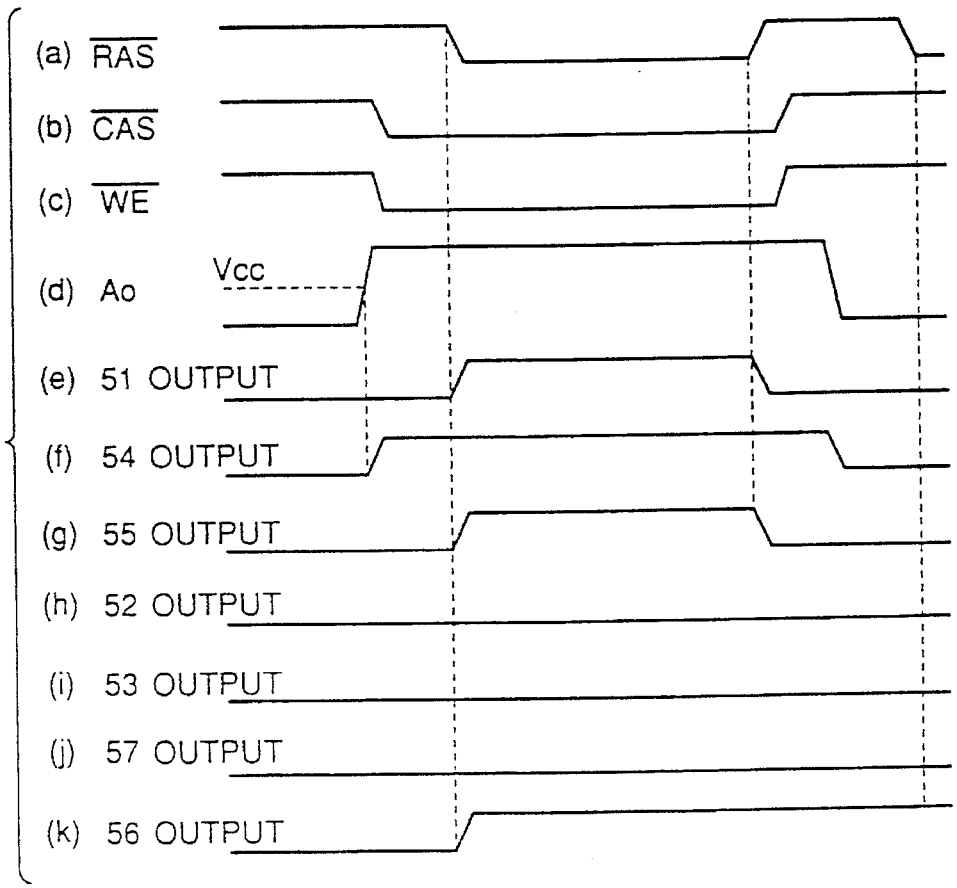
FIG. 3 is a timing chart for explaining operation of the mode detecting circuit shown in FIG. 2.
Figure 4:
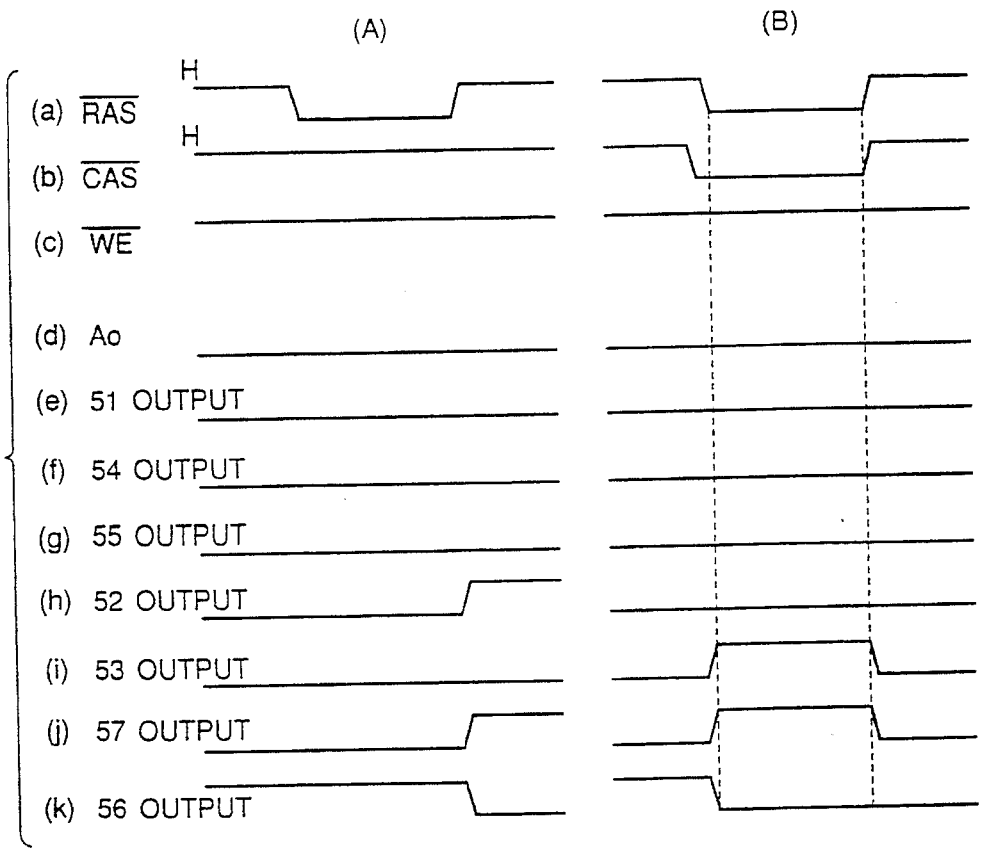
FIG. 4 is a timing chart for explaining operation of the mode detecting circuit in a normal mode and a test mode.

FIGS. 3 and 4 are timing charts for explaining operation of the mode detecting circuit of FIG. 2. As shown in FIG. 3(a), (b), (c), when the row address strobe signal $\overline{RAS}$, the column address strobe $\overline{CAS}$, and the write enable signal $\overline{WE}$ attain an "L" level in the $\overline{WE}$ $\overline{CAS}$ before $\overline{RAS}$ cycle, timing detecting circuit 51 provides a signal of an "H" level to apply the same to one input terminal of AND circuit 55, as shown in FIG. 3(e). When the address signal $A_0$ attains a predetermined voltage or more which is higher than the power supply voltage, as shown in FIG. 3(d), high threshold value buffer 54 applies a signal of an "H" level shown in FIG. 3(f) to the other input terminal of AND circuit 55. Accordingly, AND circuit 55 provides a signal of an "H" level to set flip-flop 56, as shown in FIG. 3(g). Upon this, a disturb refresh mode signal of an "H" level is provided from flip-flop 56, as shown in FIG. 3(k). As shown in (h) of FIG. 4(A), a signal of an "H" level is provided by timing detecting circuit 52 at a timing at which the row address strobe signal $\overline{RAS}$ rises to an "H" level after falling to an "L" level, or flip-flop 56 is reset by timing detecting circuit 52 at a timing at which the row address strobe signal $\overline{RAS}$ falls to an "L" level after the column address strobe signal $\overline{CAS}$ first rises to an "H" level.

Figure 5:
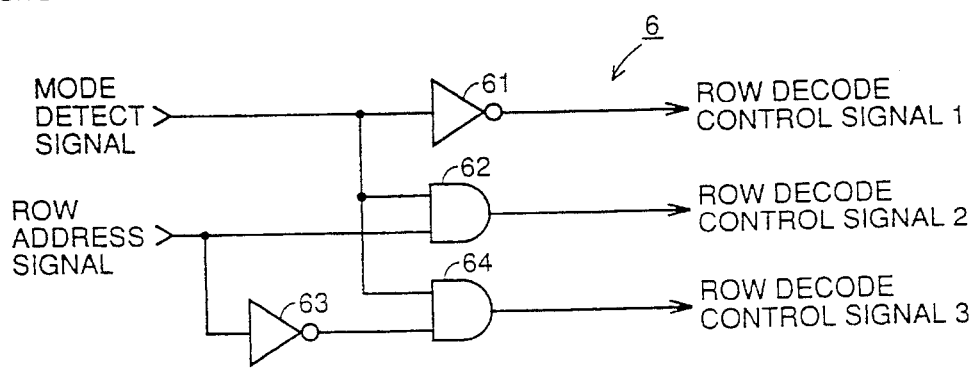
FIG. 5 is a block diagram of a row decoder control circuit shown in FIG. 1.

FIG. 5 is a circuit diagram of the row decoder control circuit shown in FIG. 1. Row decoder control circuit 6 shown in FIG. 5 activates every other word line at the time of the disturb refresh test. Row decoder control circuit 6 generally activates a word line corresponding to a row address signal. More specifically, row decoder control circuit 6 includes an inverter 61 to which a mode detect signal is applied, AND circuits 62 and 64, and an inverter 63 inverting a row address signal. Inverter 61 inverts a mode detect signal to provide a row decode control signal 1. AND circuit 62 finds AND of the mode detect signal and the row address signal to provide a row decode control signal 2. AND circuit 64 provides a row decode control signal 3 in response to the mode detect signal and the row address signal inverted by inverter 63.

Figure 6:
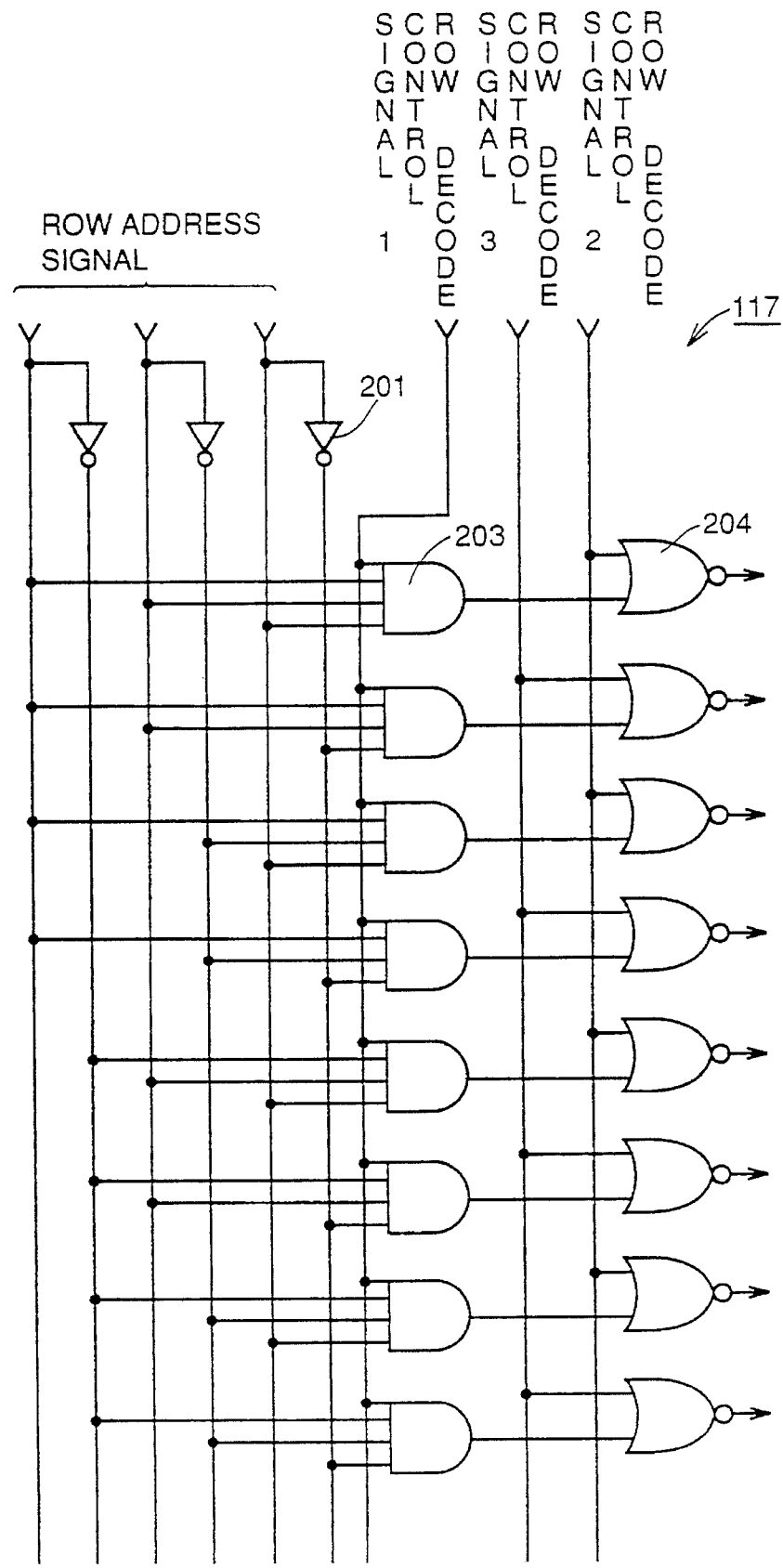
FIG. 6 is a block diagram showing one example of a row decoder shown in FIG. 1.

FIG. 6 is a block diagram showing one example of row decoder 117 shown in FIG. 1. To row decoder 117 shown in FIG. 6, a 3-bit row address signal is applied, and row decode control signals 1 to 3 are applied from row decoder control circuit 6 shown in FIG. 5. Row decoder 117 includes an inverter 201 inverting the row address signal, a 4-input AND circuit 203 receiving the row address signal or the inverted row address signal and row decode control signal 1, and an OR circuit 204 receiving the output of AND circuit 203 and row decode control signal 2 or 3.

Referring to FIGS. 1 to 6, specific operation of one embodiment of the present invention will be described. In FIG. 1, when an address signal is applied to input terminal 1, operation block selecting circuit 2 provides a block select signal for activating only a block in which a memory cell array designated by the address signal exists, to activate column decoder 111 and row decoder 117, for example. Row address buffer 4 incorporates a row address designated by the address signal to provide a row address signal to row decoder control circuit 6. In a normal write or read mode, mode detecting circuit 5 provides a signal of an "L" level since it does not detect a disturb refresh mode. The mode detect signal of an "L" level is inverted by inverter 61 of FIG. 5 to be provided as row decode control signal 1 of an "H" level. Since AND circuits 62, 64 are closed by the mode detect signal of an "L" level, row decode control signals 2, 3 both attain an "L" level. Therefore, each AND circuit 203 of FIG. 6 provides a signal in response to the row address signal and the inverted row address signal applied thereto. Since row decode control signals 2, 3 both provide a signal of an "L" level at this time, NOR circuit 204 produces the inverted output of AND circuit 203. Therefore, similar to conventional row decoder 114 shown in FIG. 20, row decoder 117 only decodes the row address signal and designates the row address of memory cell array 116 through driving circuit 115. Similar to the conventional example described with reference to FIG. 19, row decoder 111 designates a column address of memory cell array 116 through I/O gate 112 in response to the column address signal incorporated in column address buffer 3.

As is described with reference to FIGS. 2 to 4, when mode detecting circuit 5 detects the disturb refresh mode, the mode detect signal is activated into an "H" level. The mode detect signal of an "H" level is inverted by inverter 61 of FIG. 5. Row decode control signal 1 attains an "L" level and AND circuits 62, 64 are opened. The row address signal is provided as row decode control signal 2 through AND circuit 62, as well as inverted by inverter 63 to be provided as row decode control signal 3 through AND circuit 64. More specifically, row decode control signals 2, 3 are provided as row address signals contrary to each other.

In row decoder 117 shown in FIG. 6, since row decode control signal 1 attains an "L" level, AND circuit 203 provides a signal of an "L" level to NOR circuit 204. NOR circuit 204 provides a word line activation signal (active "L", stand by "H") to every other word line in response to row decode control signals 2, 3 contrary to each other.

At the disturb refresh test, a memory cell connected to an activated word line has such data written therein that brings a bit line connected to a non-activated word line to an "L" level in reading out data therefrom. Data of an "H" level is written in a memory cell connected to a non-activated word line. As is described above, the disturb refresh mode is set. In response to address input, memory cell array 116, for example, is selected by operation block selecting circuit 2. Row decode control signal 2, for example, is brought into an "H" level by the row address signal, row decode control signal 3 is brought into an "L" level by the row address signal, and every other word line of memory cell array 116 is activated by row decoder 117.

The operation mode is returned to the normal operation mode from the disturb refresh mode. In order to confirm that data of memory cells connected to word lines other than activated word lines is not destroyed, data of memory cell array 116 is read out to determine whether the data matches written data.

Predetermined data is written again in memory cell array 116. The operation mode enters the disturb refresh mode. By the row address signal, row decode control signal 2 of row decoder control circuit 6 is brought into an "L" level, and row decode control signal 3 is brought into an "H" level. After the remaining every other word line of memory cell array 116 is activated for a predetermined time, the operation mode returns to the normal mode. Data of memory cell array 116 is read out to confirm that data of memory cells connected to word lines other than activated word lines is not destroyed. As described above, by activating every other word line of memory cell array 116 simultaneously, the disturb refresh test for one block is completed. Then, memory cell array 126, which is the next block, is selected for the similar test.

As described above, according to this embodiment, when it is to be examined that, for 1024 word lines in one block, for example, a data holding time of one word line is at least 64 msec, a time required for the test is (time during which word lines are continuously activated)×(the number of word lines in a block)/(the number of word lines which are activated simultaneously)×(the number of blocks)=64 msec×1024/512×4≑0.51 sec, in the case where every other word line is caused to rise simultaneously in the embodiment shown in FIG. 1. It should be noted that a time required for writing in advance data for each memory cell and reading out and determining data of the memory cell is ignored. On the other hand, a time required for the test is 64 msec×1024/1×4≑262 sec in the case where the disturb refresh test mode according to the present invention is not used. It is apparent that the test time can be shortened in this embodiment.

Figure 7:
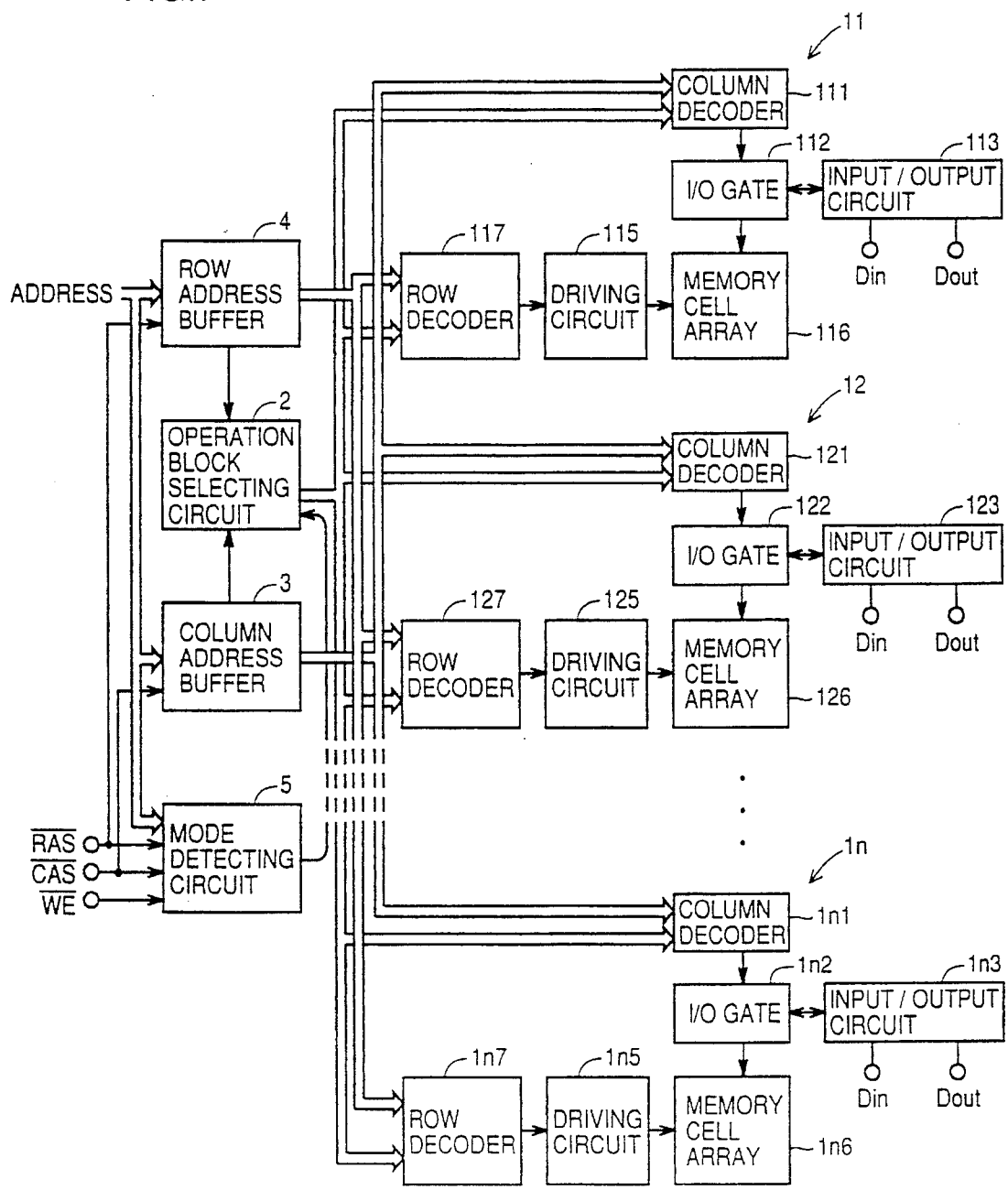
FIG. 7 is a block diagram showing another embodiment of the present invention.

FIG. 7 is a block diagram of another embodiment of the present invention. In the above-described embodiment shown in FIG. 1, the disturb refresh test is carried out for every one block of blocks 11, 12, . . . , 1n by operation block selecting circuit 2. However, in the embodiment shown in FIG. 7, a plurality of blocks 11, 12, . . . , 1n are simultaneously activated by an operation block selecting circuit 20, and the disturb refresh test is carried out by a method similar to the conventional method. For this end, a mode detect signal detected by mode detecting circuit 5 is applied to operation block selecting circuit 20.

Figure 8:
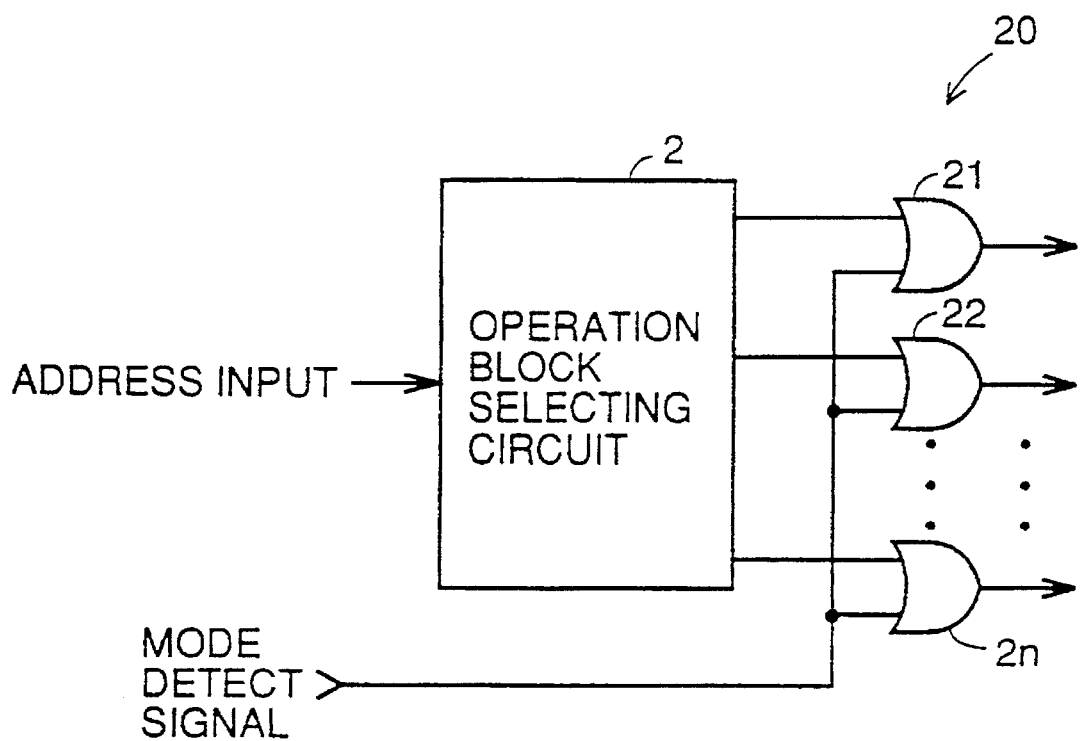
FIG. 8 is a specific block diagram of an operation block selecting circuit shown in FIG. 7.

FIG. 8 is a specific block diagram of operation block selecting circuit 20 shown in FIG. 7. In FIG. 8, in addition to the conventional operation block selecting circuit 2, OR circuits 21, 22, . . . , 2n are provided for finding OR of the output of operation block selecting circuit 2 and the mode detect signal. When the mode detect signal attains an "H" level at the time of disturb refresh, the signal of an "H" level is applied to respective blocks 11, 12, . . . , 1n as a block select signal through OR circuits 21, 22, . . . , 2n. By applying a block select signal to respective blocks 11, 12, . . . , 1n, these blocks are activated simultaneously, and the disturb refresh test is carried out in a manner similar to the conventional case of FIG. 19.

When calculated in a manner similar to the embodiment of FIG. 1, a time required for the disturb refresh test according to this embodiment is 64 msec×(1024/1)×1≑65.5 sec This time is one quarter of the conventional example. It is possible to shorten a time required for the disturb refresh test as compared to the conventional example.

In the embodiment shown in FIG. 1, every other word line is activated in the same operation block. However, two or more word lines in the same block may be activated. In this case, assuming that n word lines in the same operation block are activated, a time required for the test is 64 msec×(1024/n)×4

The disturb refresh test can be carried out in a time 1/n of the conventional example.

Figure 9:
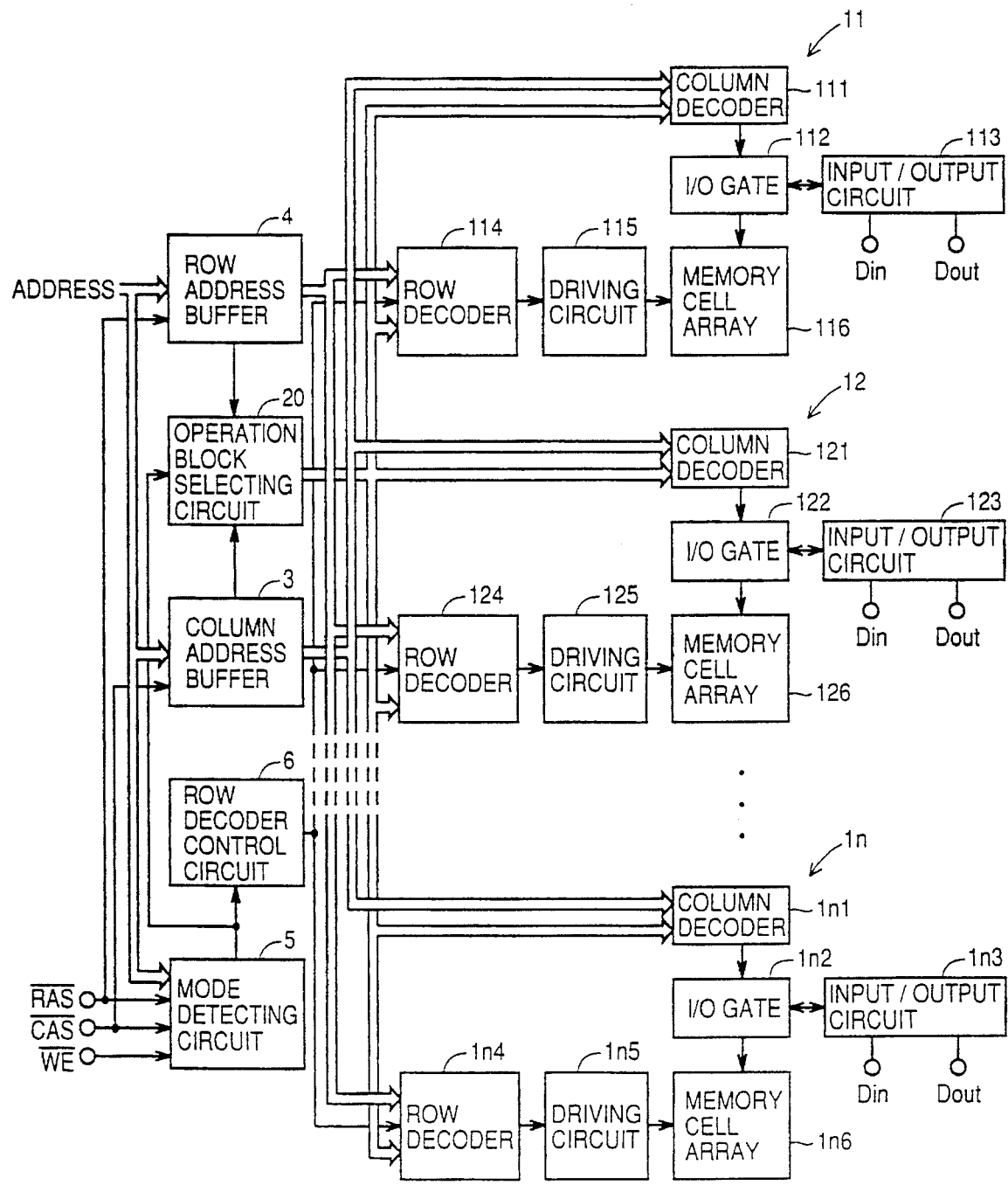
FIG. 9 is a block diagram showing a still another embodiment of the present invention.

FIG. 9 is a block diagram of a still another embodiment of the present invention. The embodiment shown in FIG. 9 is a combination of embodiments shown in FIGS. 1 and 7. More specifically, a mode detect signal detected by mode detecting circuit 5 is applied to row decoder control circuit 6 and operation block selecting circuit 20. For row decoder control circuit 6, one shown in FIG. 5 is used, and for operation block selecting circuit 20, one shown in FIG. 8 is used. Therefore, in this embodiment, similar to the embodiment shown in FIG. 7, all blocks 11, 12, . . . , 1n are selected at the time of disturb refresh. Similar to the embodiment shown in FIG. 1, every other word line of memory cells 116, 126, . . . , 1n6 of respective blocks 11, 12, . . . , in is activated for the disturb refresh test. In this embodiment, a time required for the disturb refresh test is 64 msec×(1024/512)×1=0.128 sec It is possible to further shorten the time required for the disturb refresh test.

Figure 10:
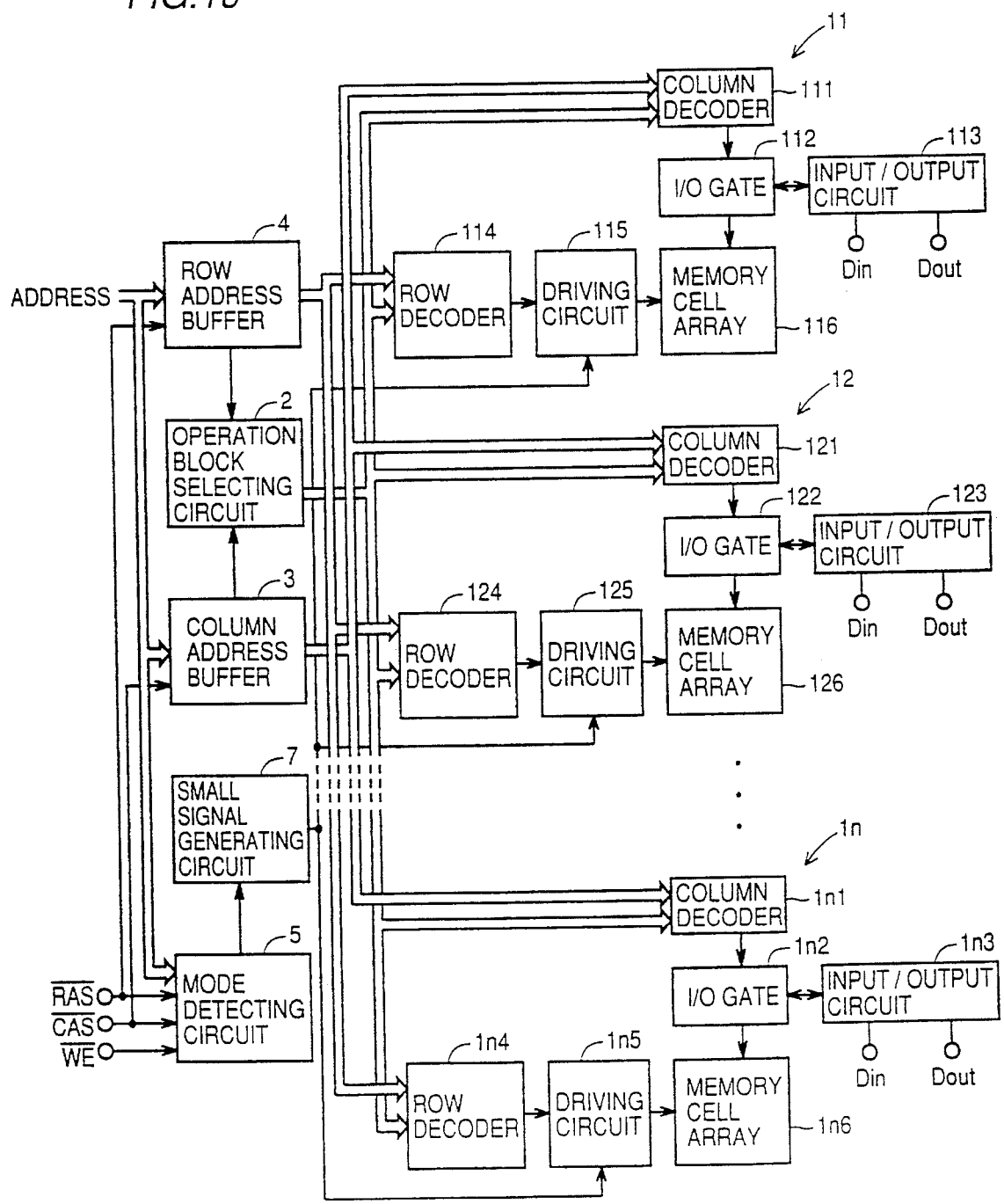
FIG. 10 is a block diagram showing a further embodiment of the present invention.

FIG. 10 is a block diagram showing a further embodiment of the present invention. In the embodiment shown in FIG. 10, a small signal is applied to a word line in the disturb refresh mode. By making use of the fact that a transistor having a lower threshold value is likely to be turned on because of the small signal, the disturb refresh test is carried out. For this end, a mode detect signal detected by mode detecting circuit 5 is applied to a small signal generating circuit 7. A small signal is generated by small signal generating circuit 7. The small signal is applied to memory cell arrays 116, 126, . . . , 1n6 through driving circuits 115, 125, . . . , 1n5.

Figure 11:
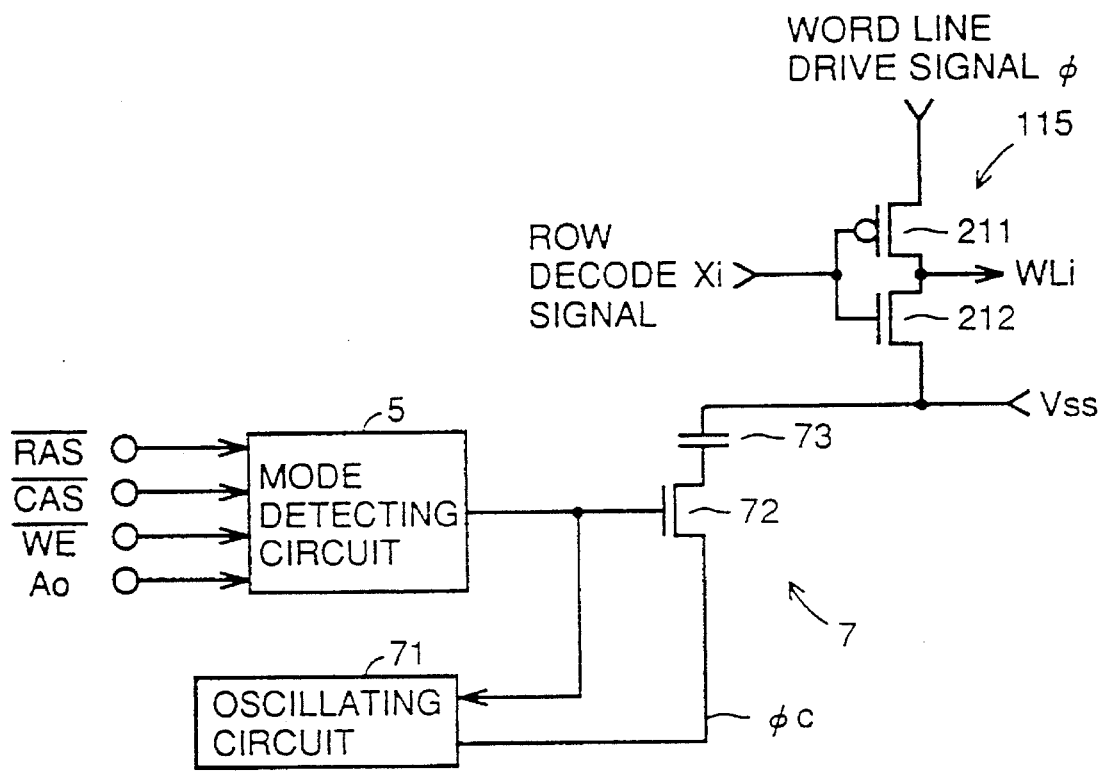
FIG. 11 is a block diagram showing a main portion which carries out a disturb refresh test using a small signal in the embodiment shown in FIG. 10.
Figure 12:
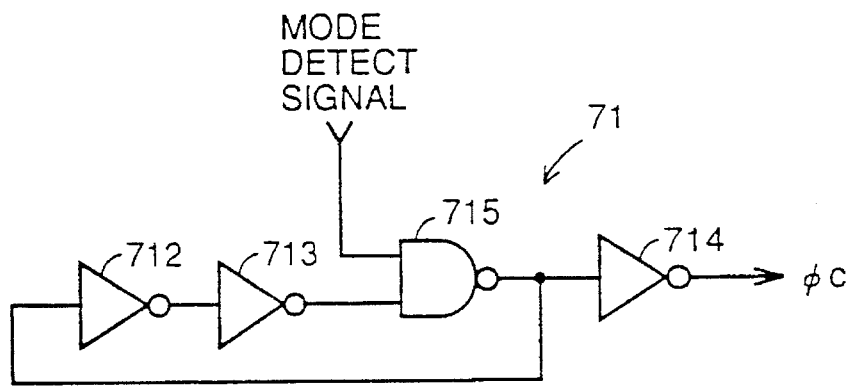
FIG. 12 is a block diagram of an oscillating circuit shown in FIG. 11.

FIG. 11 is a block diagram showing a main portion which carries out the disturb refresh test by the small signal in the embodiment shown in FIG. 10. FIG. 12 is a block diagram of an oscillating circuit shown in FIG. 11.

Figure 13:
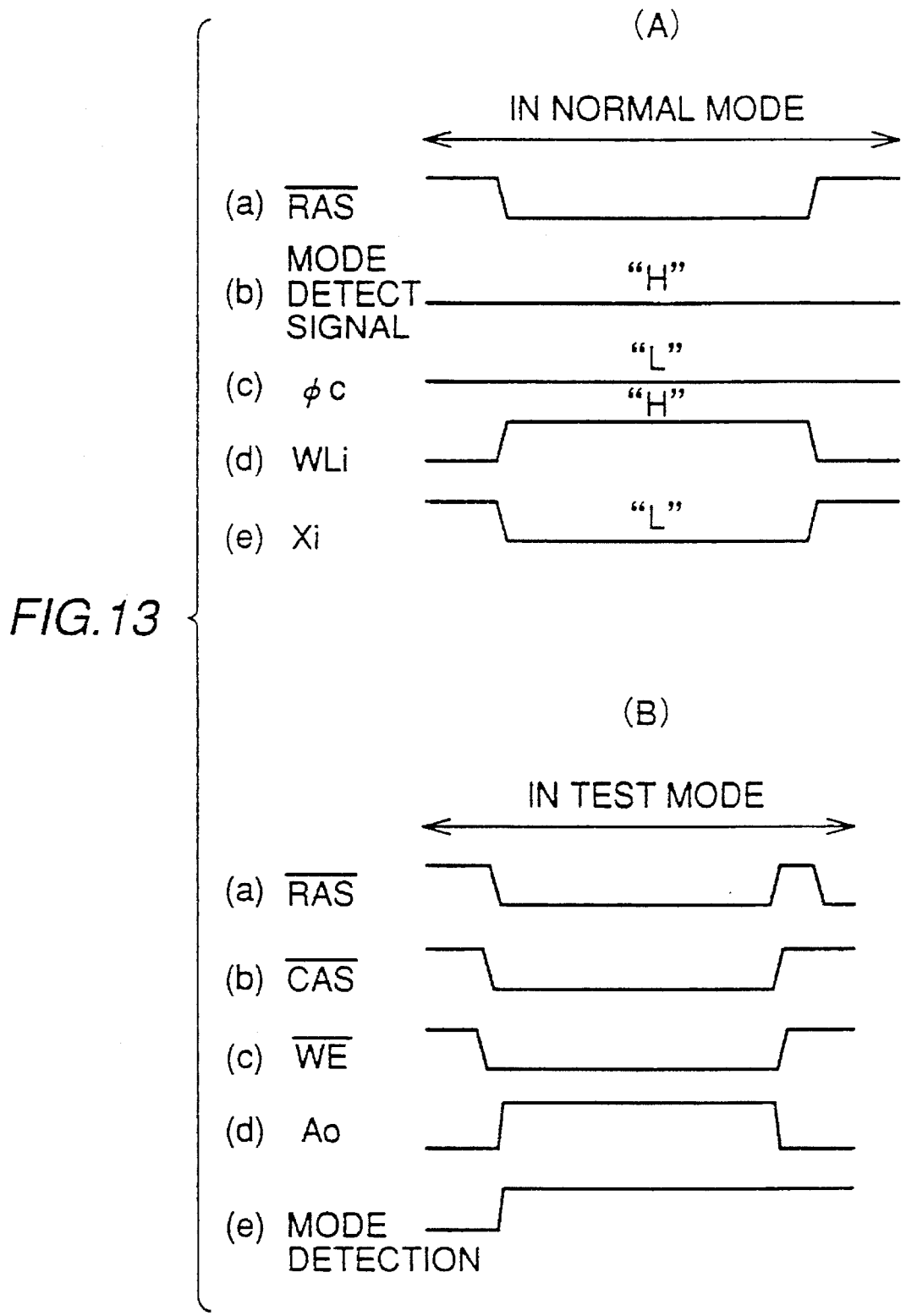
FIG. 13 is a timing chart for explaining operation of the embodiment shown in FIG. 1 in a normal mode and a test mode.

In FIG. 11, small signal generating circuit 7 includes an oscillating circuit 71, an n channel transistor 72, and a capacitor 73. As shown in FIG. 12, oscillating circuit 71 includes inverters 712 to 714 and an NAND circuit 715. When a disturb refresh mode detect signal of an "H" level is applied to one input terminal of NAND circuit 715 from mode detecting circuit 5, the output of NAND circuit 715 is applied to the other input terminal of NAND circuit 715 through inverters 712 to 713 to initiate oscillation. The oscillation output is inverted by inverter 714 to be applied to one electrode of n channel transistor 72. The mode detect signal of an "H" level is applied to the gate of n channel transistor 72 from mode detecting circuit 5. The other electrode of n channel transistor 72 is connected to a Vss line of driving circuit 115 through capacitor 73. Driving circuit 115 includes a series circuit of a p channel transistor 211 and an n channel transistor 212. A decode signal Xi is applied to respective gates of p channel transistor 211 and n channel transistor 212 from row decoder 114. The drains of p channel transistor 211 and n channel transistor 212 are connected to the word line WLi. A word line drive signal is applied to the source of p channel transistor 211. FIG. 13 is a timing chart for explaining operation of FIG. 11.

Operation of the embodiment of FIGS. 10 to 13 will be described. In the normal mode, as shown in (b) of FIG. 13(A), since a detect signal of mode detecting circuit 5 is at an "L" level, small signal generating circuit 7 does not generate a small signal. Therefore, memory cell arrays 116, 126, . . . , 1n6 shown in FIG. 10 are respectively selected by operation block selecting circuit 2, and accessed by an address signal similar to the conventional example. At the time of the disturb refresh test, block 11 shown in FIG. 10, for example, is selected by operation block selecting circuit 2. Then, a signal of a timing of the $\overline{WE}$ $\overline{CAS}$ before $\overline{RAS}$ cycle is applied to mode detecting circuit 5, and the address signal $A_0$ higher than an "H" level is applied. Upon application of these signals, data of an "L" level is written in memory cells connected to word lines activated, and data of an "H" level is written in memory cells connected to word lines not activated. As shown in FIG. 13(e), when a mode detect signal of an "H" level is provided from mode detecting circuit 5, a pulse signal repeating "H", "L" levels is generated from oscillating circuit 71. At this time, n channel transistor 72 is rendered conductive in response to the mode detect signal of an "H" level. A clock signal from oscillating circuit 71 is applied as a small signal to the Vss line of word line driving circuit 115 through n channel transistor 72 and capacitor 73. The small signal is applied to the non-selected word line WLi. A potential of a word line slightly increases in the memory cell connected to the non-selected word line in memory cell array 116. As a result, a transistor of a defective memory cell having a lower threshold value is rendered conductive. Even if the transistor is not rendered conductive, the subthreshold leakage current becomes substantially larger than that of a non-defective memory cell, causing data of an "H" level to be lost. Data is sequentially read out from memory cells corresponding to non-selected word lines, for determination of match of written data and data read out.

As described above, in the disturb refresh mode, current leakage from a memory cell capacitor to the bit line $\overline{BLi}$ is likely to occur in a transistor connected to the non-selected word line WLi and having a threshold value lower than a design value, as compared to the case in the normal mode, thereby making it possible to detect defect in a short test time.

In the case of the disturb refresh test of a DRAM of 16M×4, for example, it took 500 seconds. However, in this embodiment, a time during which word lines are kept activated, which was described in the embodiment of FIG. 1, is reduced to approximately 1/10, making it possible to carry out the test in approximately 50 seconds.

For capacitor 73 shown in FIG. 11, one having capacitance of approximately several hundred pF may also be used. Capacitor 73 is preferably disposed in the vicinity of row decoders 114, 124, . . . , 1n4 distant from a Vss pad. More specifically, if capacitor 73 is disposed near the pad Vss, the potential of a pulse is rapidly brought to Vss resulting in attenuation of the pulse. Therefore, it is preferred that capacitor 73 is disposed so that the distance to the Vss pad is shorter than the distance to row decoder 115.

Figure 14:
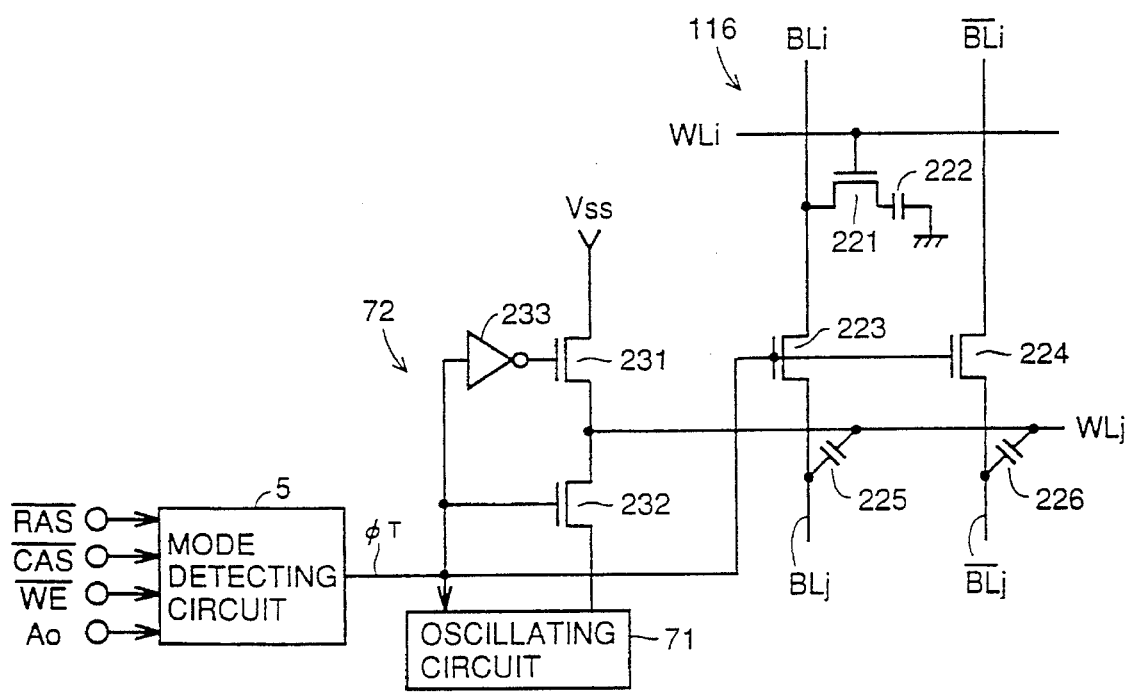
FIG. 14 is a block diagram showing a main portion of a further embodiment of the present invention.

FIG. 14 is a diagram showing a further embodiment of the present invention. In this embodiment, in addition to the conventional word line WLi, a dedicated word line WLj for applying a small signal to bit lines BLi, $\overline{BLi}$ is provided. Parasitic capacitances 225, 226 exist between the word line WLj and bit lines BLj, $\overline{BLj}$. n channel transistors 223, 224 are connected between the bit lines BLi, $\overline{BLi}$ and BLj, $\overline{BLj}$. These n channel transistors 223, 224 are rendered conductive when the disturb refresh mode is detected by mode detecting circuit 5.

Small signal generating circuit 72 includes oscillating circuit 71, n channel transistors 231, 232, and inverter 233. A detect signal of mode detecting circuit 5 is inverted by inverter 233 to be applied to the gate of n channel transistor 231. The detect signal of mode detecting circuit 5 is applied to the gate of n channel transistor 232. The oscillation output of oscillating circuit 71 is applied to the drain of n channel transistor 232. The word line WLj is connected to the source of n channel transistor 232 and the drain of n channel transistor 231. The potential of Vss is applied to the source of n channel transistor 231.

Figure 15:
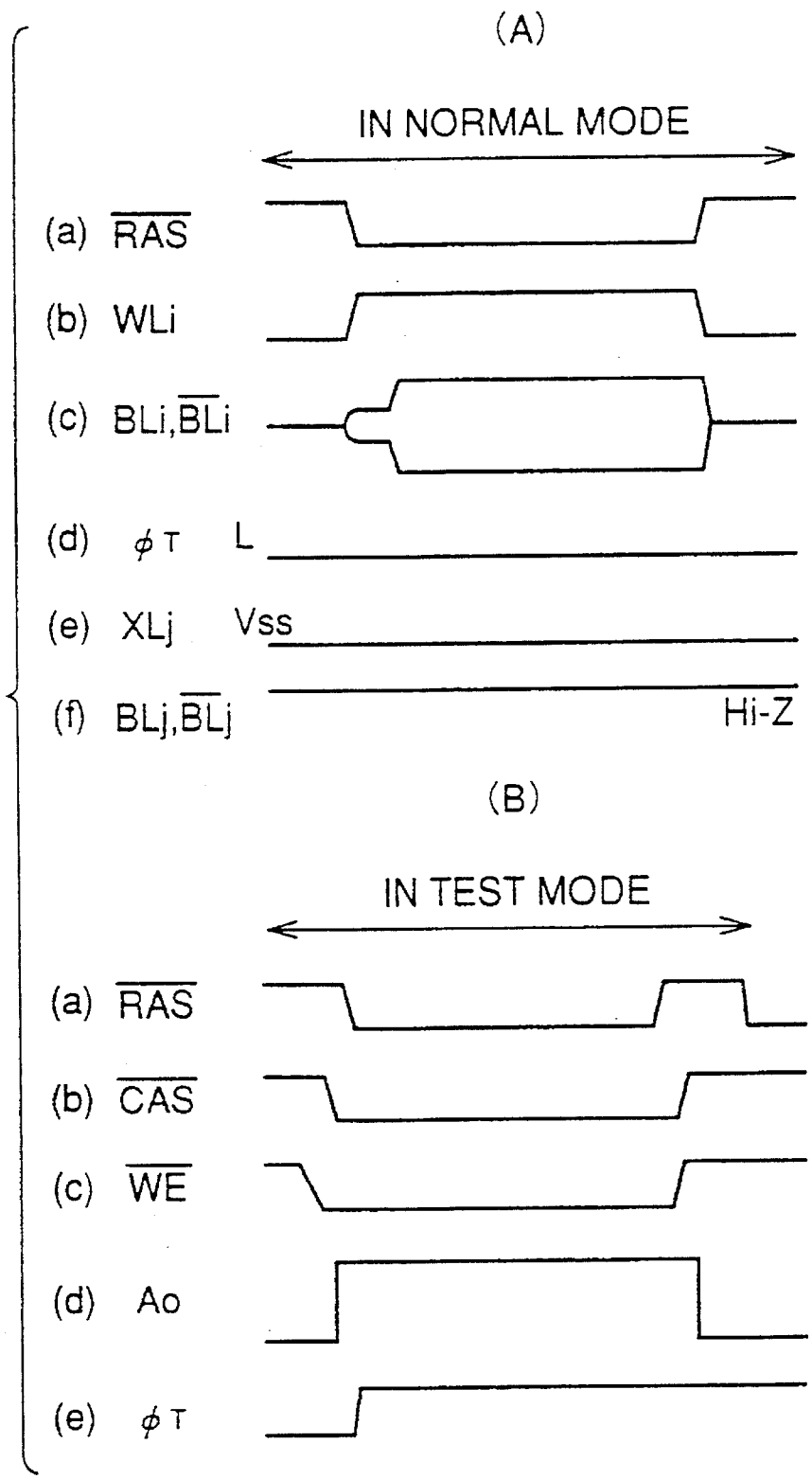
FIG. 15 is a timing chart of the embodiment shown in FIG. 14 in a normal mode and a test mode.

FIG. 15 is a timing chart for explaining operation of the embodiment shown in FIG. 14. In the normal mode shown in FIG. 15(A), a detect signal $\phi_T$ of mode detecting circuit 5 attains an "L" level, as shown in (d) of FIG. 15(A), n channel transistor 231 is turned on, and other n channel transistors 232, 223, 224 are turned off. Therefore, the bit lines BLj, $\overline{BLj}$ are separated from the bit lines BLi, $\overline{BLi}$, and attain a high impedance state, as shown in (f) of FIG. 15(A). Since the word line WLj is connected to the Vss potential, as shown in (a) of FIG. 15(A), the memory cell array is accessed by the address signal similar to the conventional case.

As shown in FIG. 15(B), mode detecting circuit 5 detects the $\overline{WE}$ $\overline{CAS}$ before $\overline{RAS}$ cycle and a predetermined voltage or more which is higher than an ordinary "H" level attained by the address signal $A_0$. Upon the detection, the mode detect signal $\phi_T$ attains an "H" level as shown in (e) of FIG. 15(B), n channel transistor 231 is turned off, and other n channel transistors 232, 223, and 224 are rendered conductive. Therefore, oscillating circuit 71 initiates the oscillation operation in response to the detection output of mode detecting circuit 5. The oscillation output of oscillating circuit 71 is transmitted to the word line WLj through n channel transistor 232. The oscillation output of oscillating circuit 71 is further transmitted to the bit lines BLi, $\overline{BLi}$ from the bit lines BLj, $\overline{BLj}$ through parasitic capacitances 225, 226. As a result, the bit lines BLi, $\overline{BLi}$ attain a negative potential instantaneously, unlike the case in the normal mode. A transistor having a threshold value lower than a design value is rendered conductive at the instance. Even if it is not rendered conductive, the subthreshold leakage current becomes substantially larger than that of a transistor having a normal threshold value. Therefore, data of an "H" level is lost. Since a time during which word lines are continuously activated, which is described in FIG. 1, can be reduced, it is possible to shorten a test time required for the disturb refresh test. Although the bit lines BLj, $\overline{BLj}$ attain a negative potential, the bit lines BLj, $\overline{BLj}$ do not attain a potential of a negative potential $V_{BB}$ applied to the substrate or less. Therefore, a current does not flow between the bit lines and the substrate.

Figure 16:
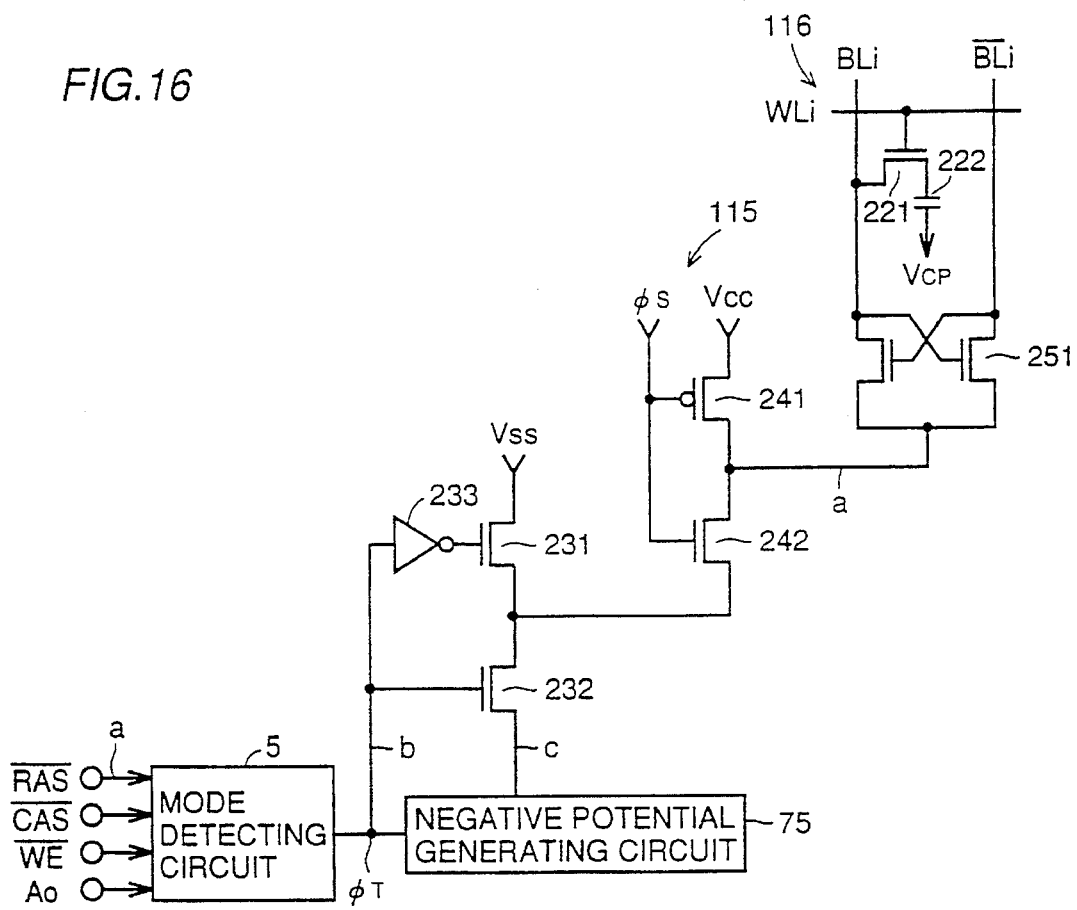
FIG. 16 is a diagram showing a further embodiment of the present invention.
Figure 17:
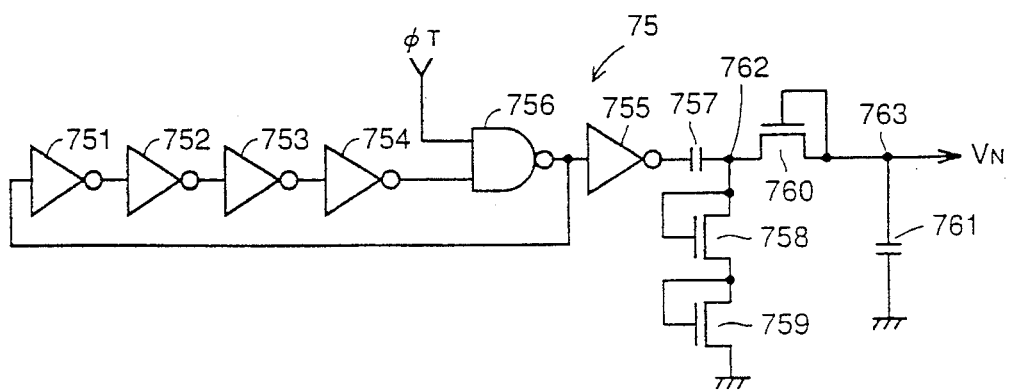
FIG. 17 is a schematic diagram of a negative potential generating circuit shown in FIG. 16.

FIG. 16 is a diagram showing a further embodiment of the present invention. FIG. 17 is a diagram showing a negative potential generating circuit of FIG. 16.

In this embodiment, a negative voltage is transmitted to a drive signal of a sense amplifier 251 for a certain period only in the disturb refresh mode, and a memory cell transistor having a threshold value lower than a design value is likely to be turned on. More specifically, a negative potential generating circuit 75 is provided in place of small signal generating circuit 7 shown in FIG. 10. Negative potential generating circuit 75 includes, as shown in FIG. 17, an oscillating circuit including inverters 751 to 755 and an NAND gate 756, a charge pump circuit configured of n channel transistors 758 and 759, a capacitor 757, and an n channel transistor 760, and a capacitor 761 for charging electric charge. When capacitor 761 is charged to a negative potential $-\Delta V$, and a signal $\phi_T$ of an "H" level is applied to NAND gate 756 from mode detecting circuit 5, the oscillating circuit initiates the oscillation operation. When the oscillating circuit provides to one electrode of capacitor 757 a signal rising from an "L" level to an "H" level, the potential of a node 762 becomes 2 Vth or more because of capacitance coupling of capacitor 757 (Vth is a threshold voltage of n channel transistors 758, 759). n channel transistors 758, 759 are rendered conductive, and a discharge current flows to a ground node through these transistors 758, 759 from node 762. When the potential of node 762 is decreased to $-2$ Vth, n channel transistors 758, 759 are rendered non-conductive. Since the potential of a node 763 is lower than that of the drain of node 762 at this time, n channel transistor 760 remains non-conductive. When the oscillating circuit provides a signal which falls from an "H" level to an "L" level, the potential of node 762 falls to a negative potential from 2 Vth because of capacitance coupling of capacitor 757. Since the potential of node 763 is higher than the potential of node 762, n channel transistor 760 is rendered conductive, and electric charge is dram from node 763 to node 762. When the potential of node 763 is higher than the potential of node 762 by Vth, n channel transistor 760 is rendered non-conductive. By repetition of the operation, the negative potential is generated.

The detect signal of mode detecting circuit 5 is applied to the gate of n channel transistor 232, and inverted by inverter 233 to be applied to the gate of n channel transistor 231. A negative potential $-\Delta V$ generated by negative potential generating circuit 75 is applied to the source of n channel transistor 232. The drain of n channel transistor 232 and the source of n channel transistor 231 are connected to the source of n channel transistor 242 of driving circuit 115. The potential of Vss is applied to the drain of n channel transistor 231. The sense amplifier drive signal $\phi$s is applied to the gate of n channel transistor 242. The sense amplifier drive signal $\phi$s is also applied to the gate of p channel transistor 241. The power supply voltage +Vcc is applied to the source of p channel transistor 241. The drain of p channel transistor 241 is connected to the drain of n channel transistor 242 and to a sense amplifier 251. $-\Delta V$ is selected to be a potential between $-|Vth|$ and $-|2 Vth|$, for example, approximately $-1.4$ V.

Figure 18:
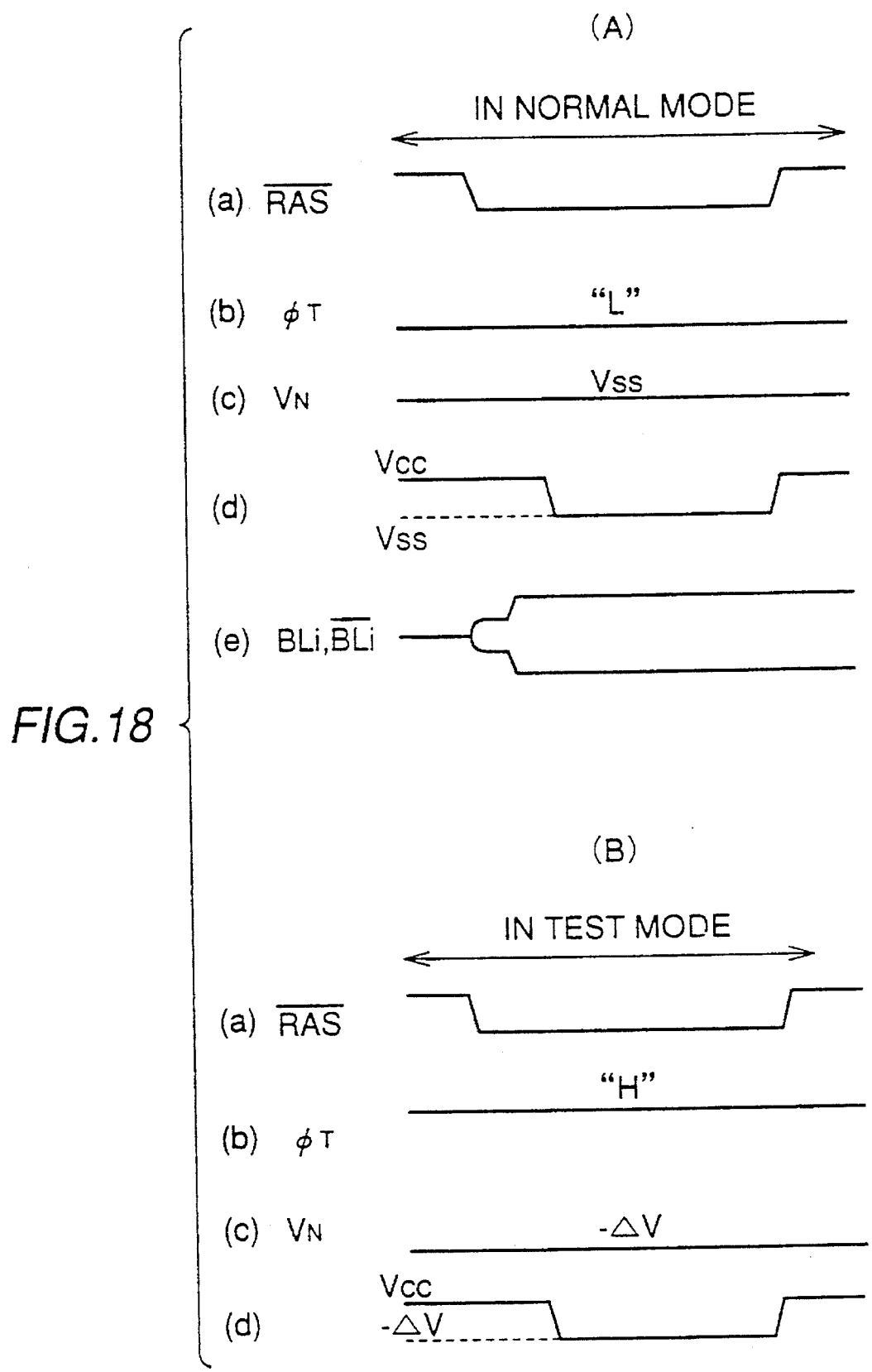
FIG. 18 is a timing chart for explaining operation of the embodiment shown in FIG. 16 in a normal mode and a test mode.

FIG. 18 is a timing chart for explaining operation of the embodiment shown in FIG. 16. In the normal mode operation, as shown in FIG. 18(A), since a detect signal of node detecting circuit is at an "L" level, n channel transistor 231 is turned on, and n channel transistor 232 is turned off. Therefore, when a sense amplifier drive signal of an "H" level is applied to the gate of n channel transistor 242, n channel transistor 242 is rendered conductive and the potential of Vss is applied to sense amplifier 251. As a result, as shown in (e) of FIG. 18(A), either of the bit lines BLi, $\overline{BLi}$ is pulled down from 1/2 Vcc to Vss by the sense amplifier.

On the other hand, in the disturb refresh mode, since a detect signal of mode detecting circuit 5 attains an "H" level, the potential of $-\Delta AV$ is generated from negative potential generating circuit 75. In response to the mode detect signal of an "H" level, n channel transistor 232 is rendered conductive, and n channel transistor 242 is also rendered conductive in response to the sense amplifier drive signal $\phi$s. Therefore, the negative potential of $-\Delta V$ is applied to sense amplifier 251. As a result, either of the bit lines BLi, $\overline{BLi}$ is pulled down from 1/2 Vcc to $-\Delta V$, as shown in (e) of FIG. 18(B). A memory transistor having a threshold value lower than a design value is rendered conductive. Even if it is not rendered conductive, the subthreshold leakage current of the memory transistor becomes substantially larger than that of a transistor having a normal threshold value, causing stored data of an "H" level to be lost.

Figure 19:
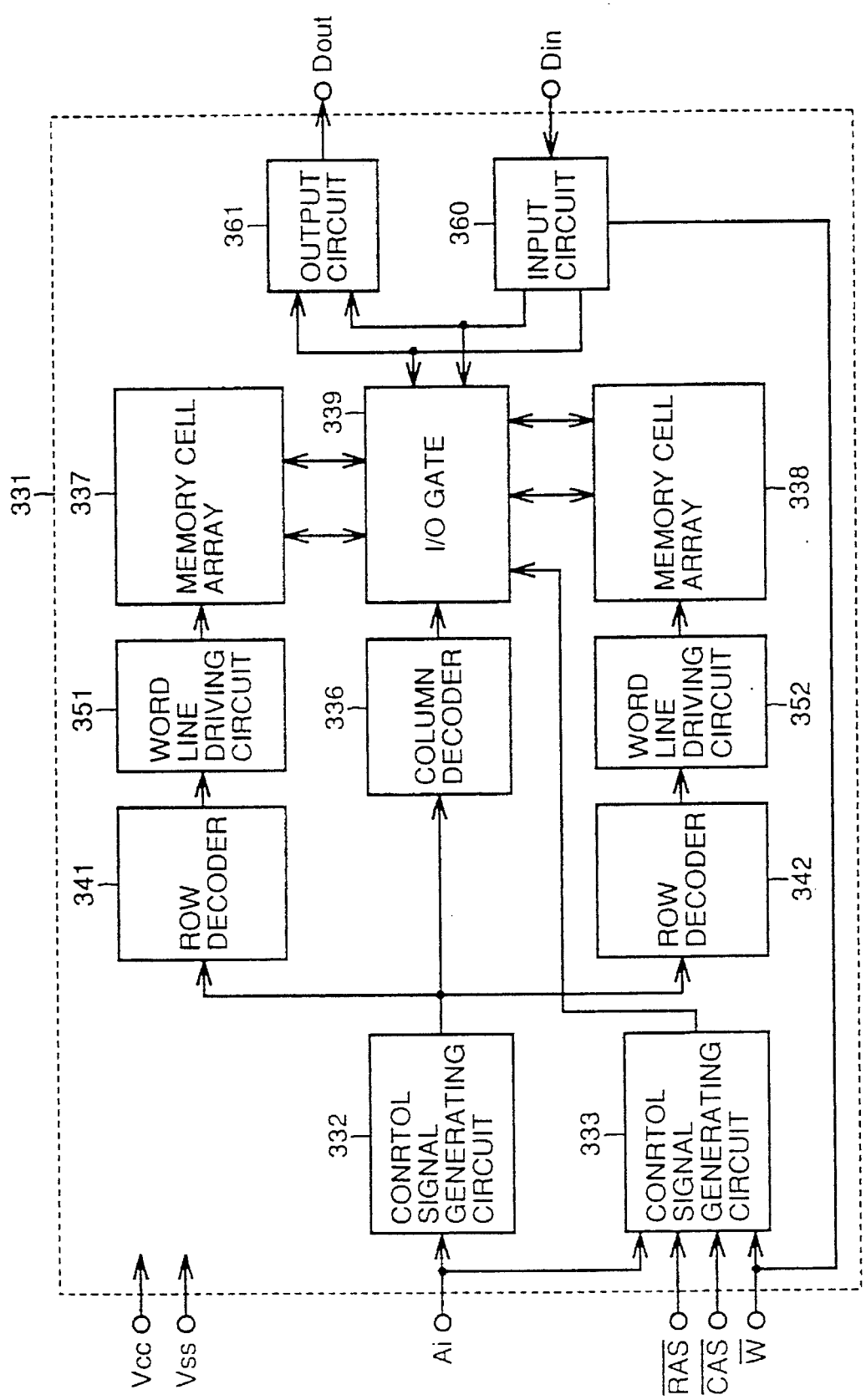
FIG. 19 is a block diagram showing an entire configuration of a further embodiment of the present invention.

FIG. 19 is a block diagram showing an entire configuration of a further embodiment of the present invention. In the embodiment shown in FIG. 19, the present invention is applied to a DRAM 331 using a so-called shared sense amplifier in which one sense amplifier is shared by two memory cell arrays. DRAM 331 includes a control signal generating circuit 333 including a test mode detecting circuit. Similar to the conventional DRAM, DRAM 331 further includes an address buffer 332, row decoders 341, 342, word line driving circuits 351, 352, a column decoder 336, memory cell arrays 337,338, an I/O gate 339, an input circuit 360, and an output circuit 361. Address buffer 332 receives an address signal Ai, to provide an X address signal and a Y address signal to row decoders 341, 342 and column decoder 336, respectively. n response to input of the X address signal, row decoders 341, 342 provide a word line drive signal WLi to word line driving circuits 351, 352. Word lines of memory cell arrays 337, 338 are activated by word line driving circuits 351, 352. In response to input of the Y address signal, column decoder 336 selects a bit line through I/O gate 339. Input circuit 360 provides externally applied data to I/O gate 339. Output circuit 361 provides data read from memory cell arrays 337,338 and applied through I/O gate 339 to the outside world.

Figure 20:
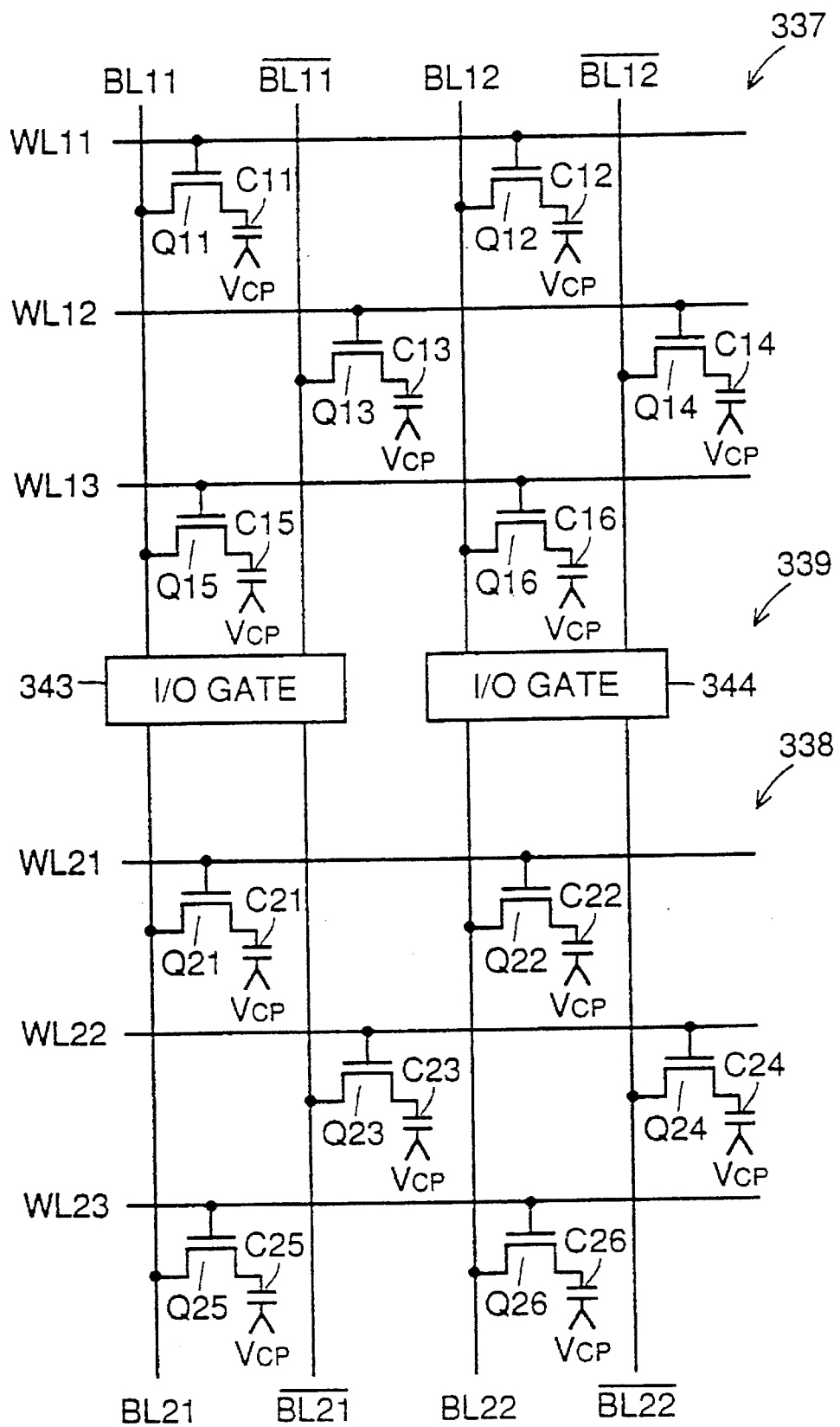
FIG. 20 is a diagram showing a configuration of a memory cell shown in FIG. 19.

FIG. 20 is a diagram showing a configuration of the memory cell arrays shown in FIG. 19. In FIG. 20, memory cell array 337 includes plural rows of word lines WL11, WL12, WL13, and plural columns of bit line pairs BL1, $\overline{BL1}$, BL2, $\overline{BL2}$. A memory cell formed of a memory cell transistor Q11 and a memory cell capacitor C11 is connected to a crossing of the word line WL11 and the bit line BL11 of one of the bit line pairs. Similarly, memory cells formed of memory cell transistors Q12 to Q16 and memory cell capacitors C12 to C16 are connected to respective crossings of WL11 and BL12, WL12 and $\overline{BL11}$, WL12 and $\overline{BL12}$, WL13 and BL11, and WL13 and BL12.

Similarly, memory cell array 338 includes plural rows of word lines WL21 to WL23, and plural columns of bit line pairs BL21, $\overline{BL21}$, BL22, $\overline{BL22}$. Memory cells formed of memory cell transistors Q21 to Q26 and memory cell capacitors C21 to C26 are connected to respective crossings of WL21 and BL21, WL21 and BL22, WL22 and $\overline{BL21}$, WL22 and $\overline{BL22}$, WL22 and $\overline{BL21}$, WL22 and $\overline{BL22}$, WL23 and BL21, and WL23 and BL22.

Bit lines BL11, $\overline{BL11}$ and BL21, $\overline{BL21}$ are connected to an I/O gate 343, and bit lines BL12, $\overline{BL12}$ and BL22, $\overline{BL22}$ are connected to an I/O gate 344.

Figure 21:
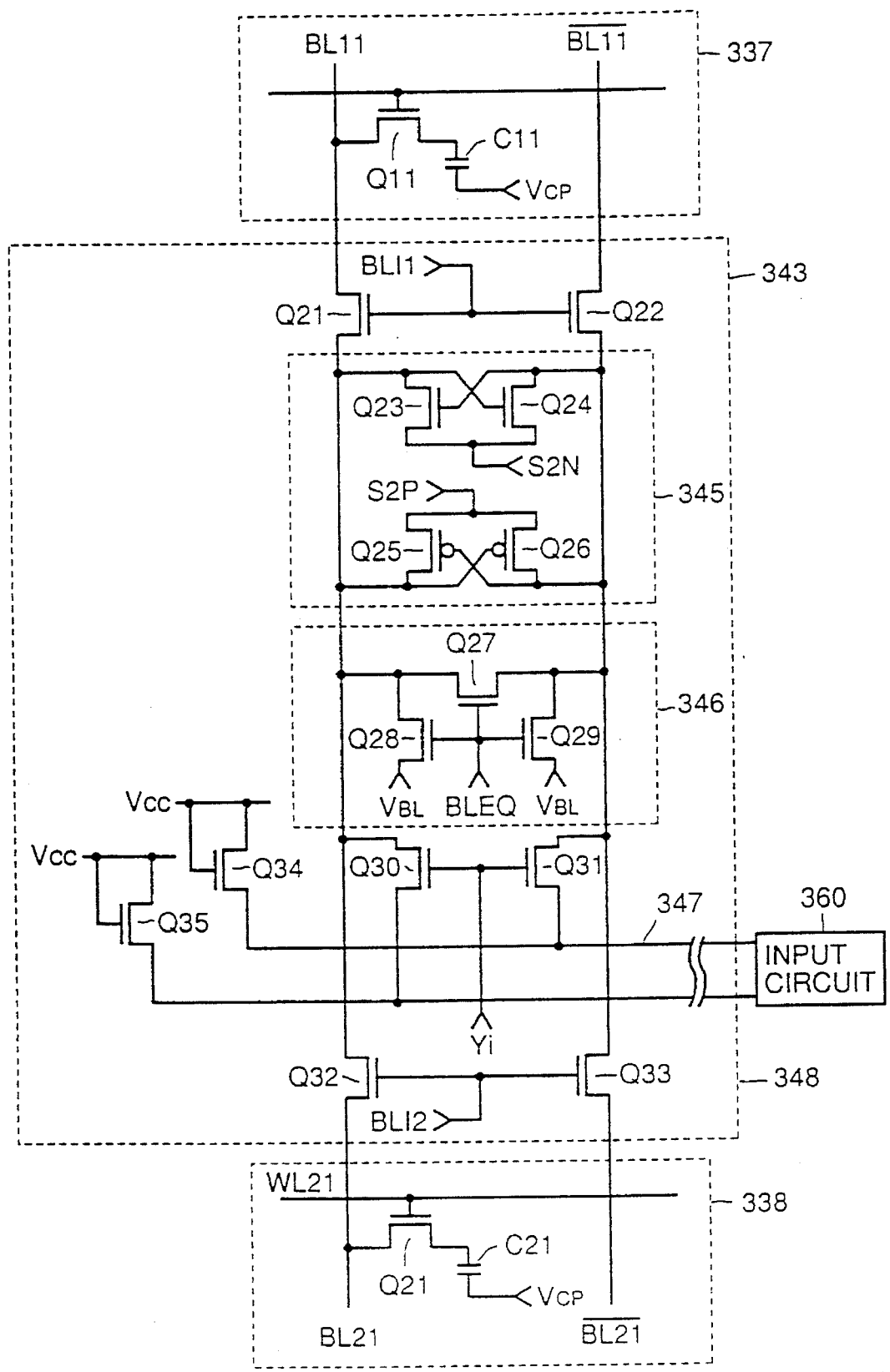
FIG. 21 is an electric circuit diagram of an I/O gate serving as a part of two memory cell arrays.

FIG. 21 is an electric circuit diagram of a part of two memory cell arrays and the I/O gate. In FIG. 21, I/O gate 343 includes a sense amplifier 345, a bit line equalize precharge circuit 346, and n channel transistors Q21, Q22, Q30 to Q35.

Sense amplifier 345 includes an n channel cross-couple sense amplifier having n channel transistors Q23 and Q24 cross-coupled to each other, driven in response to a first drive signal S2N, and increasing a bit line potential on the high potential side of a bit line pair, and a p channel cross-couple restore circuit having p channel transistors Q25 and Q26 cross-coupled to each other, driven in response to a second drive signal S2P, and decreasing a bit line potential on the low potential side. Bit line equalize precharge circuit 346 includes n channel transistors Q27 to Q29. In response to a constant voltage $V_{BL}$ of ½·Vcc and a bit line equalize signal BLEQ, bit line equalize precharge circuit 346 equalizes and precharges bit line pairs BL11, $\overline{BL11}$, BL21, $\overline{BL21}$.

In response to a first switch signal BLI1, n channel transistors Q21 and Q22 connect the bit lines BL11, $\overline{BL11}$ to sense amplifier 345. In response to a second switch signal BLI2, n channel transistors Q32 and Q33 connect the bit lines BL21, $\overline{BL21}$ to sense amplifier 345.

In response to a column decode signal Yi, n channel transistors Q30 and Q31 connect I/O and $\overline{I/O}$ lines 23 and 24 to sense amplifier 345. n channel transistors Q34 and Q35 are load circuits of I/O line 23 and $\overline{I/O}$ line 24. n channel transistors Q34 and Q35 charge I/O line 347 and $\overline{I/O}$ line 348 to a Vcc–Vth level.

Figure 22:
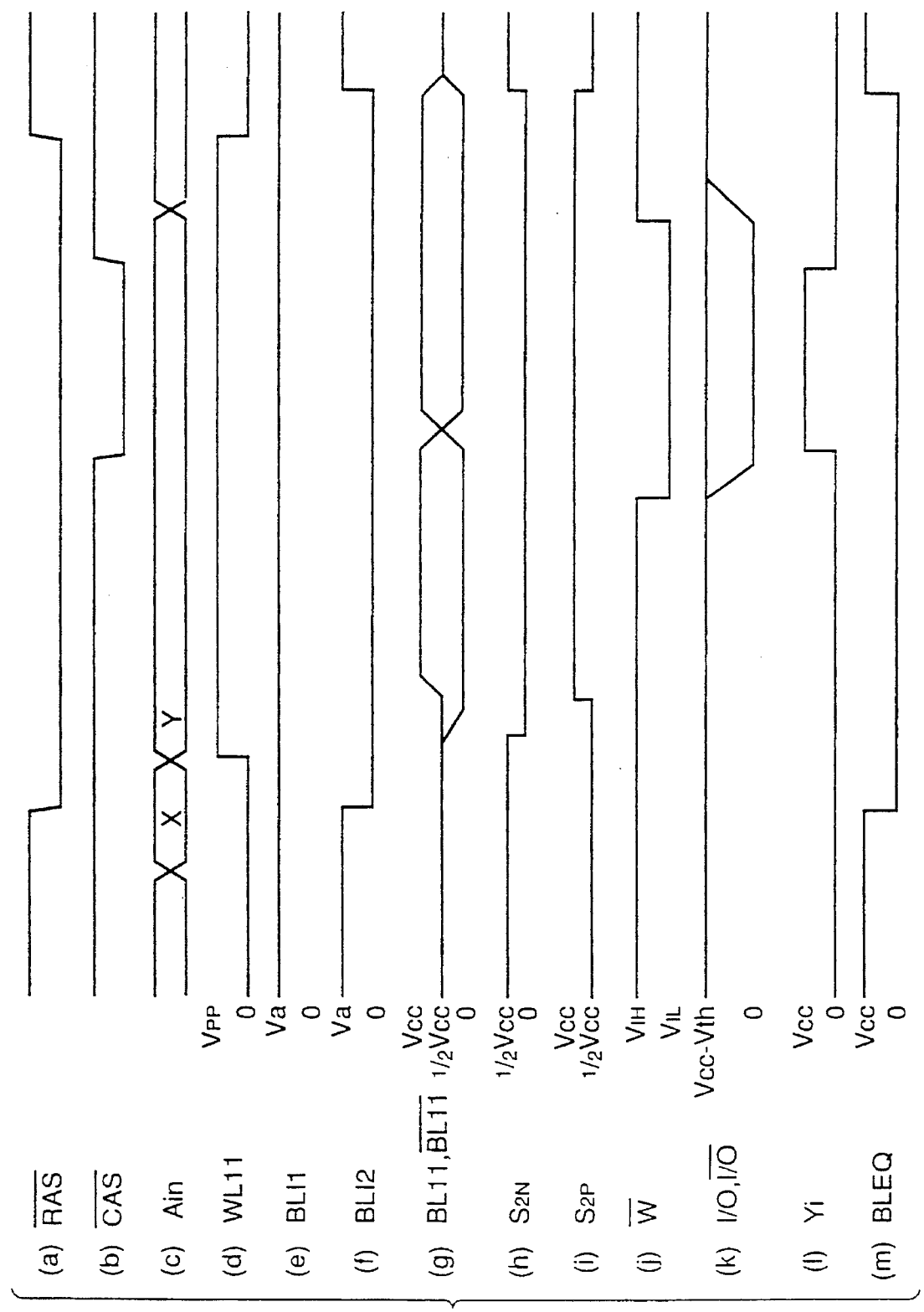
FIG. 22 is a timing chart for explaining operation of the circuit shown in FIG. 21.

FIG. 22 is a timing chart for explaining operation of the circuit shown in FIG. 21. Description will first be given of the reading operation, which is the same as the case of the conventional DRAM. More specifically, when a row address strove signal $\overline{RAS}$ shown in FIG. 22(a) falls to an "L" level, the second switch signal BLI2 is switched from a potential Va in the normal operation (for example, 7 V) to 0 V as shown in FIG. 22(f) by a switch signal generating circuit shown in FIG. 25 to be described later. As a result, n channel transistors Q32 and Q33 are turned off to disconnect memory cell array 338 and sense amplifier 345. At this time, the first switch signal BLI1 is set to the potential Va as shown in FIG. 22(e). Therefore, n channel transistors Q21 and Q22 are turned on to connect memory cell array 337 with sense amplifier 345.

In response to the row address strobe signal $\overline{RAS}$, the word line WL11 rises from 0 V to a potential Vpp (a boosted voltage in general, for example 7 V) as shown in FIG. 22(d) to render memory cell transistor Q11 conductive. At this time, as shown in FIG. 22(m), the equalize signal BLEQ is at an "L" level. The bit line pair BL11, $\overline{BL11}$ is precharged to a bit line holding potential $V_{BL}$ of ½·Vcc. Electric charge is transmitted from memory cell capacitor C11 to bit line BL11. As shown in FIG. 22(g), a potential difference is produced between bit lines BL11 and $\overline{BL11}$. When the sense amplifier drive signal S2N falls from ½·Vcc to 0 V as shown in FIG. 22(h), and the sense amplifier drive signal S2P rises from ½·Vcc to the power supply voltage Vcc as shown in FIG. 22(i), sense amplifier 345 is driven and the potential difference between bit lines BL11 and $\overline{BL11}$ is amplified by sense amplifier 345. Then, the column decode signal Yi is brought to an "H" level. n channel transistors Q30 and Q31 are turned on. Data amplified by sense amplifier 345 is provided to I/O line 347 and $\overline{I/O}$ line 348 to be provided to the outside world through output circuit 361.

Description will now be given of the writing operation of data in the normal operation. When a write control signal $\overline{W}$ attains an "L" level as shown in FIG. 22(j), and write data is applied to input circuit 360, the write data is transmitted from input circuit 360 to I/O line 347, $\overline{I/O}$ line 348. When the Y address signal is decoded by column decoder 336 shown in FIG. 19, and the column decode signal Yi rises to the power supply voltage Vcc as shown in FIG. 22(l), n channel transistors Q30 and Q31 are turned on. Further, the bit line switch signal BLI1 rises to the potential Va to turn on n channel transistors Q21 and Q22. Write data transmitted to I/O line 347, $\overline{I/O}$ line 348 is transmitted to the bit line pair BL11, $\overline{BL11}$ through n channel transistor Q21. At this time, the word line WL11 rises to the potential Vpp, memory cell transistor Q11 is turned on, and write data transmitted to the bit line BL11 is written in memory cell capacitor C11 through memory cell transistor Q11.

In response to the row address strobe signal $\overline{RAS}$, the word line drive signal falls from the potential Vpp to 0 V, memory cell transistor Q11 is turned off, and memory cell capacitor C11 is disconnected from the bit line BL11. In response to the word line WL11 falling to 0V, the bit line switch signal BLI1, the sense amplifier drive signals S2N, S2P, and the bit line equalize signal BLEQ are reset, and the potential of the bit lines BL11, $\overline{BL11}$ is held at the bit line holding potential $V_{BL}$ of approximately ½·Vcc.

The operation in the test mode will now be described. In the test mode, the level of the first switch signal BLI1 applied to the gates of n channel transistors Q21 and Q22, and the level of the second switch signal BLI2 applied to the gates of n channel transistors Q32 and Q33 are set to, for example, Vcc–Vth, which is lower than the level Va (=6 to 8 v) in the normal operation. As a result, the potential written in memory cell capacitors C11, C21 is lowered, making it possible to easily detect a memory cell leaking small current.

Description will now be given of a configuration for setting the levels of the first and second switch signals BLI1 and BLI2 lower than the normal operation.

Figure 23:
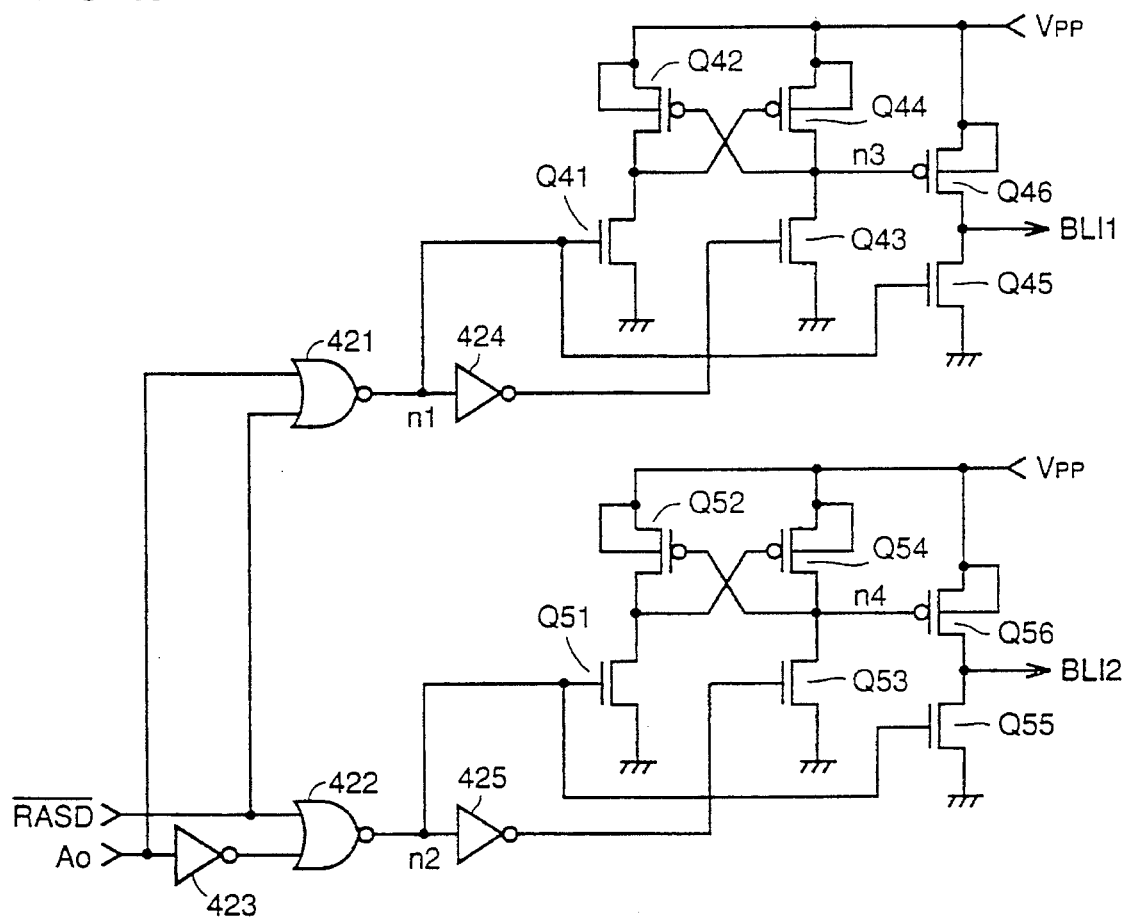
FIG. 23 is an electric circuit diagram showing a switch signal generating circuit.

FIG. 23 is an electric circuit diagram showing a switch signal generating circuit, including two switching circuits switching the levels of the first and second switch signals BLI1 and BLI2. Based on the row address strobe signal $\overline{RAS}$, a $\overline{RASD}$ signal is provided from the control circuit shown in FIG. 19 to be applied to respective one input terminals of NOR gates 421, 422. An address signal $A_0$ is applied to the other input terminal of NOR gate 421, as well as to the other input terminal of NOR gate 422 after inverted by an inverter 423. In one switching circuit, the output of NOR gate 421 is applied the gates of n channel transistors Q41 and Q45, as well as to the gate of n channel transistor Q43 after inverted by an inverter 424. n channel transistor Q41 has its source connected to the ground, and its drain connected to the drain of a p channel transistor Q42 and the gate of p channel transistor Q44. The potential Vpp is applied to the respective sources of p channel transistors Q42 and Q44. p channel transistor Q44 has its drain connected to the drain of n channel transistor Q43, the gate of p channel transistor Q42, and the gate of p channel transistor Q46. The source of n channel transistor Q43 is grounded. p channel transistor Q46 has its source supplied with the potential Vpp, and its drain connected to the drain of p channel transistor Q45, from the connection point of which the first switch signal BLI1 is provided. The source of n channel transistor Q45 is grounded.

The other switching circuit includes an inverter 425, n channel transistors Q51, Q53, Q55, and p channel transistors Q52, Q54, Q56. These inverters and transistors are connected similar to the case of the one switching circuit, and the level of the second switch signal BLI2 is switched.

Figure 24:
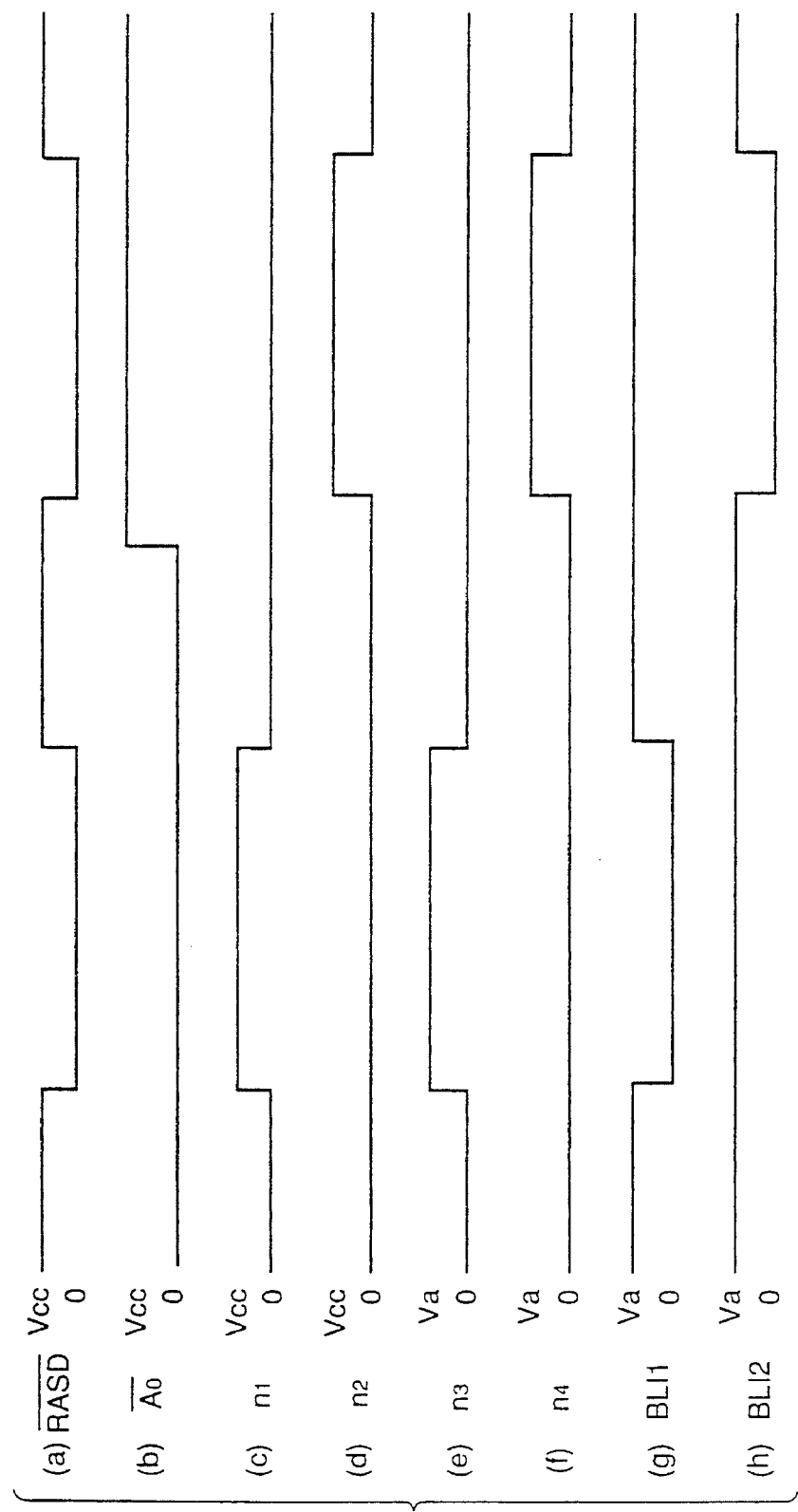
FIG. 24 is a timing chart for explaining operation of the switch signal generating circuit shown in FIG. 23.

FIG. 24 is a timing chart for explaining the operation of the switching circuits shown in FIG. 23. Referring to FIG. 24, the RASD signal falls from the power supply voltage Vcc to 0 V as shown in FIG. 24(a). If the address signal $A_0$ is 0 V as shown in FIG. 24(b), a node n1 attains the power supply voltage Vcc level as shown in FIG. 24(c), and a node n2 attains 0 V as shown in FIG. 24(d). Therefore, n channel transistors Q41 and Q45 are turned on, while n channel transistor Q43 is turned off because the output of inverter 424 attains an "L" level. In response to n channel transistor Q41 turning on, p channel transistor Q44 is turned on, and a node n3 attains the same potential Va as that of the switch signal drive signal Vpp as shown in FIG. 24(e). p channel transistor Q46 is turned off, and n channel transistor Q45 is turned on, whereby the first switch signal BLI1 attains 0 V as shown in FIG. 24(g).

In the other switching circuit, since node n2 is 0 V, n channel transistors Q51 and Q55 are turned off. Since the output of inverter 425 attains an "H" level, n channel transistor Q53 is turned on, and node n4 attains 0 V as shown in FIG. 24(f). Since p channel transistor Q56 is turned on, and n channel transistor Q55 is turned off, the potential Va is provided as the second switch signal BLI2.

More specifically, when the address signal $A_0$ is 0 V, the first switch signal BLI1 holds the potential Va, and the second switch signal BLI2 attains 0 V from the potential Va. When the address signal $A_0$ is at the power supply voltage Vcc, the first switch signal BLI1 changes from the potential Va to 0 V, and the second switch signal BLI2 holds the potential Va.

Figure 25:
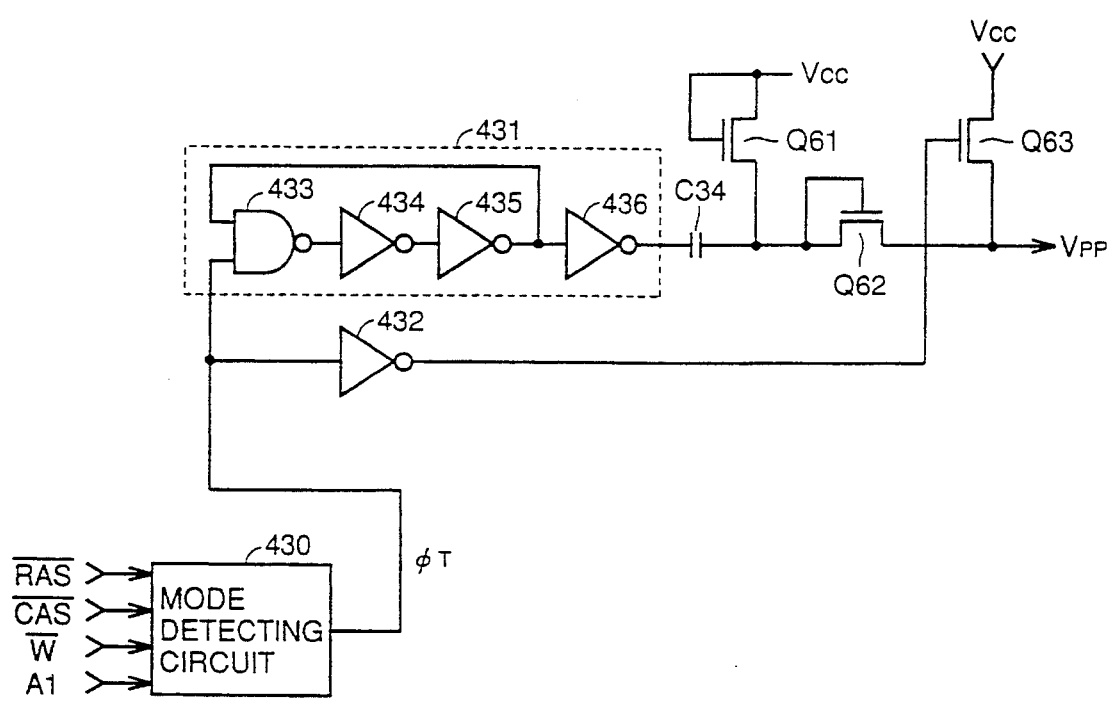
FIG. 25 is an electric circuit diagram showing a switch signal drive signal generating circuit.

FIG. 25 is an electric circuit diagram showing a switch signal drive signal generating circuit. The switch signal drive signal generating circuit shown in FIG. 25 provides the Vcc–Vth level as a switch signal drive signal Vpp in the test mode instead of the switch signal drive signal Vpp in the normal operation, to supply the same to the switching circuits shown in FIG. 23.

A mode detecting circuit 430 detects a test mode in response to the row address strobe signal $\overline{RAS}$, the column address strobe signal $\overline{CAS}$, the write signal W and the address signal A1. The address signal A1 in the test mode is set to a predetermined voltage higher than an "H" level in the normal operation. Mode detecting circuit 430 provides a test mode switch signal $\phi_T$ which attends the level Va in response to detection of the normal operation mode, and which attains 0 V in response to detection of the test mode, to apply the same to an oscillating circuit 431 and inverter 432. Oscillating circuit 431 includes an NAND gate 433, and inverters 434, 435 and 436. Oscillating circuit 431 oscillates in response to the mode switch signal $\phi_T$ attaining the power supply voltage Vcc. The oscillation output of oscillating circuit 431 is applied to the source of n channel transistor Q61 and the gate and source of n channel transistor Q62 through capacitor C34. n channel transistor Q61 has its gate and drain supplied with the power supply voltage Vcc. The source of n channel transistor Q62 is connected to the source of n channel transistor Q63, from the connection point of which the switch signal drive signal Vpp is provided. The mode switch signal $\phi_T$ inverted by inverter 432 is applied to the gate of n channel transistor Q63.

Figure 26:
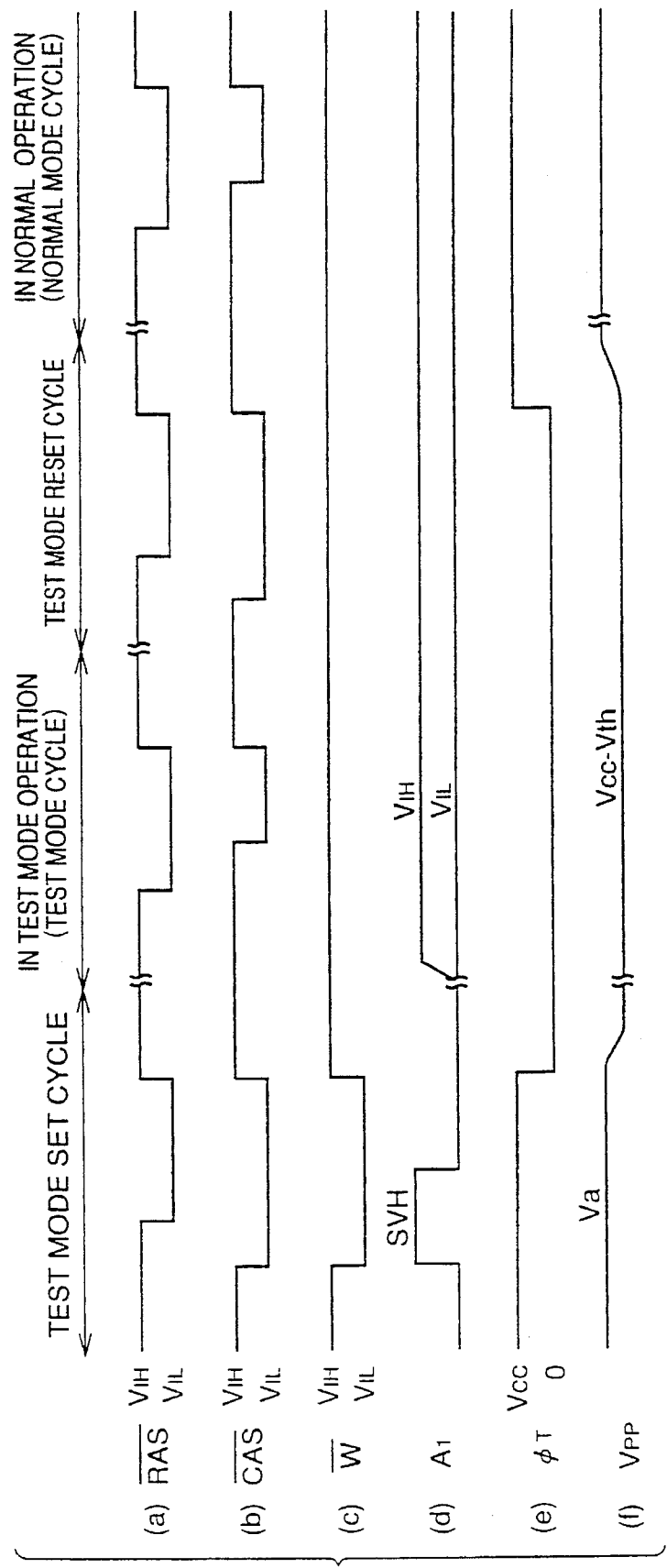
FIG. 26 is a timing chart for explaining operation of the switch signal drive signal generating circuit shown in FIG. 25.

FIG. 26 is a timing chart for explaining operation of the switch signal drive signal generating circuit shown in FIG. 25. Referring to FIG. 26, when the row address strobe signal $\overline{RAS}$ falls as shown in FIG. 26(a), mode detecting circuit 430 detects $V_{IL}$ level (0–0.8 V in general) of the column address strobe signal $\overline{CAS}$ as shown in FIG. 26(b), $V_{IL}$ level of the write signal W as shown in FIG. 26(c), and the potential (for example 8–9 V) higher than the power supply voltage Vcc level (=5 V) in the normal operation of the address signal A1 as shown in FIG. 26(t). In response to detection, the mode switch signal $\phi_T$ attains 0 V as shown in FIG. 26(e). In response to 0 V of the mode switch signal $\phi_T$, the operation enters the test mode. Oscillating circuit 431 stops the oscillating operation, and the mode switch signal $\phi_T$ is inverted by inverter 432. Therefore, n channel transistor Q63 is turned on, and the level of the switch signal drive signal Vpp attains vcc–Vth (generally approximately 2–3 V) as shown in FIG. 26(f), from the potential Va (generally approximately 6–8 V). As described above, in the test mode cycle when the mode switch signal $\phi_T$ attains 0 V, a test for detecting a memory cell leaking small current is carried out.

In order to go out from the test mode cycle, mode detecting circuit 430 sets the mode switch signal $\phi_T$ to the power supply voltage Vcc level in response to falling of the row address strobe signal $\overline{RAS}$, the column address strobe signal $\overline{CAS}$ attaining the $V_{IL}$ level, the write signal $\overline{W}$ attaining a $V_{IH}$ level (generally approximately 2.4 to 6 V), and the address signal A1 set to an arbitrary level. More specifically, the operation enters the normal mode cycle. When the semiconductor memory is actually incorporated in the memory board, the operation is used in the normal mode cycle. The mode switch signal $\phi_T$ is at the power supply voltage Vcc level in the normal mode cycle. Therefore, n channel transistor Q63 is turned off, oscillating circuit 431 oscillates, capacitor C34 is charged/discharged in response to the oscillation output, the potential is increased by n channel transistor Q61 and the switch signal drive signal Vpp attains its initial potential Va.

According to the embodiment of the present invention, the operation enters the test mode by setting the address signal A1 to a potential higher than the power supply voltage in the normal operation. The level of the switch signal drive signal Vpp is set to Vcc–Vth, which is lower than the potential Va in the normal operation. Based on the switch signal drive signal Vpp, the potentials of the first and second bit line switch signals BLI1, BLI2 are set to Vcc–Vth. Therefore, it is possible to decrease the potential written in memory cell capacitors C11, C21, and to easily detect a memory cell leaking small current, resulting in a shortened test time.

Figure 27:
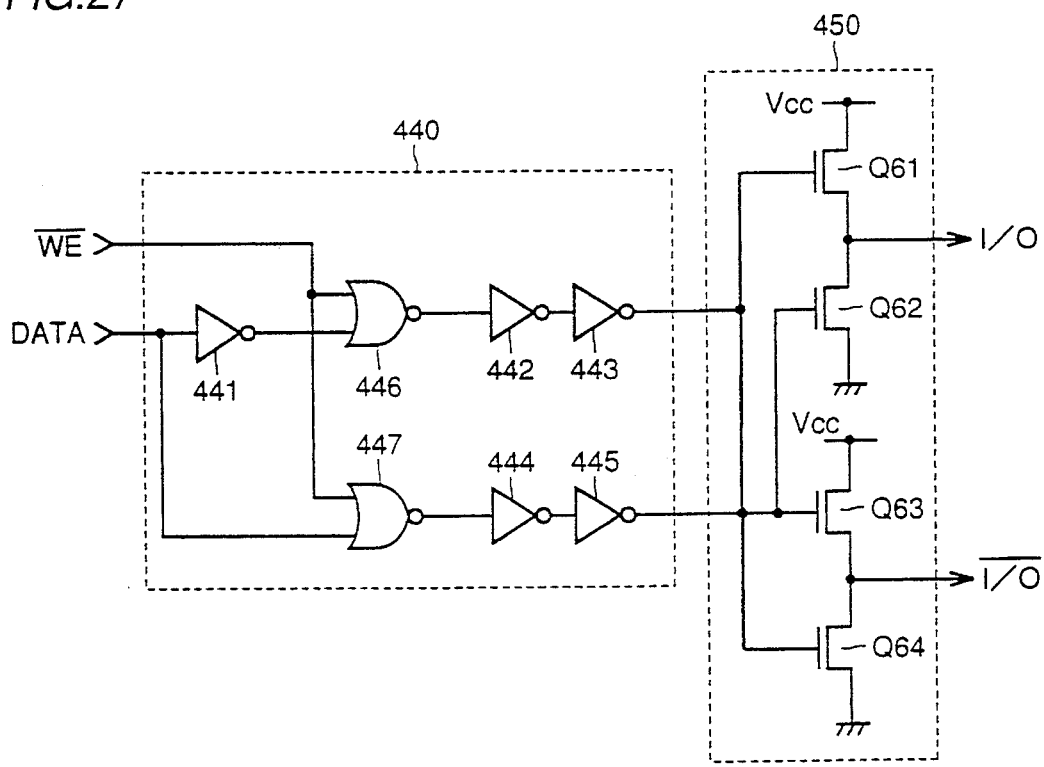
FIG. 27 is an electric circuit diagram showing one example of an input circuit.

FIG. 27 is an electric circuit diagram showing one example of the input circuit shown in FIG. 21. In FIG. 21, the input circuit includes a driving circuit 440 and an output circuit 450. Driving circuit 440 includes inverters 441 to 445, and NOR gates 446,447. The write signal $\overline{W}$ is applied to respective one input terminals of NOR gates 446,447, and data is applied to the other input terminal of NOR gate 447. At the same time, data is inverted by inverter 441 to be applied to the other input terminal of NOR gate 446. The output of NOR gate 446 is applied to the gates of n channel transistors Q61 and Q64 included in output circuit 450 through inverters 442, 443. The output of NOR gate 447 is applied to respective gates of n channel transistors Q62 and Q63 through inverters 444 and 445. n channel transistor Q61 has its drain supplied with the power supply voltage vcc, and its source connected to the drain of n channel transistor Q62, from the connection point of which the $\overline{I/O}$ output signal is provided. n channel transistor Q63 has its drain supplied with the power supply voltage Vcc, and its source connected to the drain of n channel transistor Q64, from the connection point of which the $\overline{I/O}$ output signal is provided.

Figure 28:
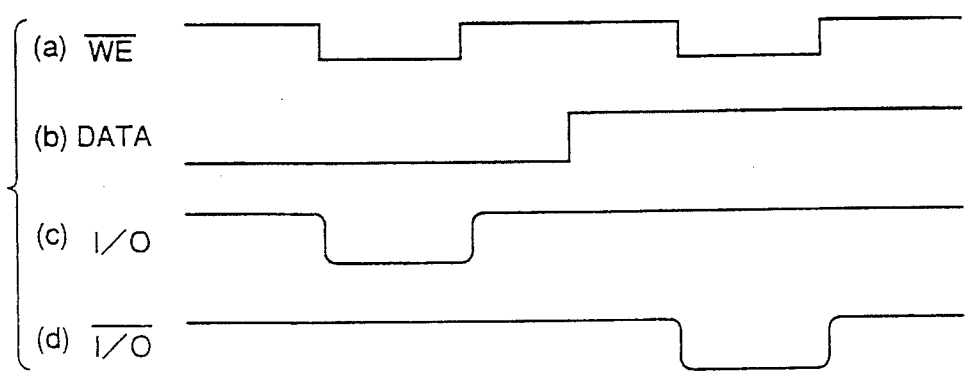
FIG. 28 is a timing chart for explaining operation of the input circuit shown in FIG. 27.

FIG. 28 is a timing chart for explaining operation of the input circuit shown in FIG. 27. When the write signal $\overline{W}$ falls as shown in FIG. 28(a), and data is at 0 V as shown in FIG. 28(b), the output of NOR gate 446 attains an "L" level. The signal of an "L" level is applied to respective gates of n channel transistors Q61 and Q64 through inverters 442, 443 to turn off these transistors. On the other hand, the output of NOR gate 447 attains an "H" level. The signal of an "H" level is applied to n channel transistors Q62 and Q63 through inverters 444 and 445 to turn on these transistors. Therefore, the I/O output signal attains an "L" level as shown in FIG. 28(c), and the I/O output signal attains an "H" level as shown in FIG. 28(d). Conversely, when the write signal $\overline{W}$ falls and data attains an "H" level, the I/O output signal attains an "H" level, and the $\overline{I/O}$ output signal attains an "L" level.

Figure 29:
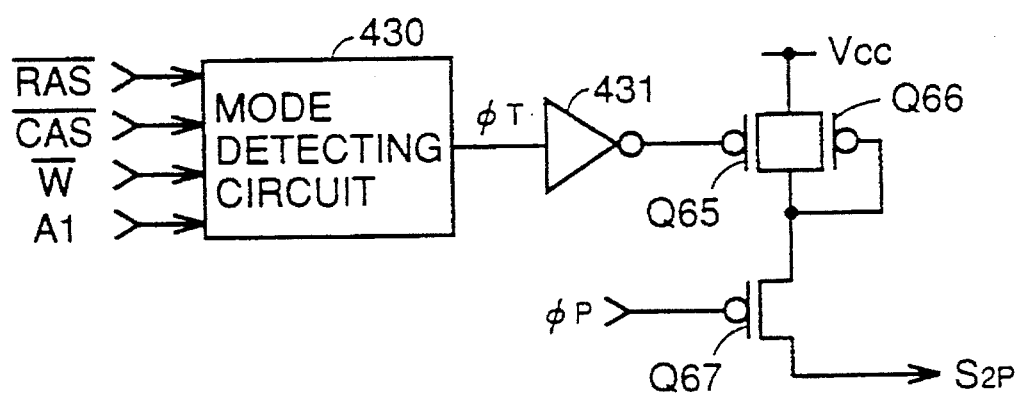
FIG. 29 is a diagram showing a further embodiment of the present invention.

FIG. 29 is a diagram showing a further embodiment of the present invention. In this embodiment, the level of the sense amplifier drive signal S2P is adapted to attain Vcc–Vth in the test mode. More specifically, the potential of the sense amplifier drive signal S2P applied to sense amplifier 21 shown in FIG. 21 is pulled up from the ½·Vcc level to the power supply voltage Vcc level as shown in FIG. 22(a) in the normal reading operation. However, the potential of the sense amplifier drive signal S2P is set to the Vcc–Vth level in the test mode.

The mode detect signal $\phi_T$ provided from mode detecting circuit 430 configured similar to the case of FIG. 25 is inverted by inverter 431 to be applied to the gate of p channel transistor Q65. The drain of p channel transistor Q65 and the drain of p channel transistor Q66 are supplied with the power supply voltage Vcc. The source of p channel transistor Q65 is connected to the source and the gate of p channel transistor Q66, as well as to the drain of p channel transistor Q67. A control signal $\phi_p$ generated in response to rising of the word line drive signal is applied to the gate of p channel transistor Q67.

In this embodiment, the test mode is detected by mode detecting circuit 430, and the mode detect signal $\phi_T$ is inverted by inverter 431 to be applied to the gate of p channel transistor Q65. In response to application of the mode detect signal $\phi_T$, P channel transistor Q65 is turned on, and p channel transistor Q66 is also turned on. When the control signal $\phi_P$ attains an "L" level in response to rising of the word line, p channel transistor Q67 is turned on, and a signal of the Vcc–Vth level is provided as the sense amplifier drive signal S2P.

According to this embodiment, since the level of the sense amplifier drive signal S2P falls in the test mode, it is possible to lower the level written in memory cell capacitor C11. A memory cell can be easily detected in which data to be read to the bit line, which must be originally at an "H" level, attains an "L" level because of a small current leakage from memory cell capacitor C11.

Figure 30:
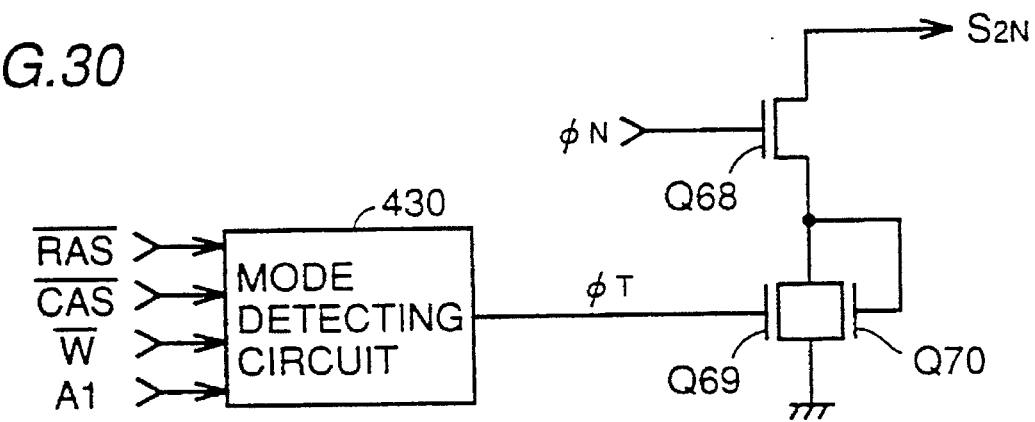
FIG. 30 is a diagram showing a further embodiment of the present invention.
Figure 31:
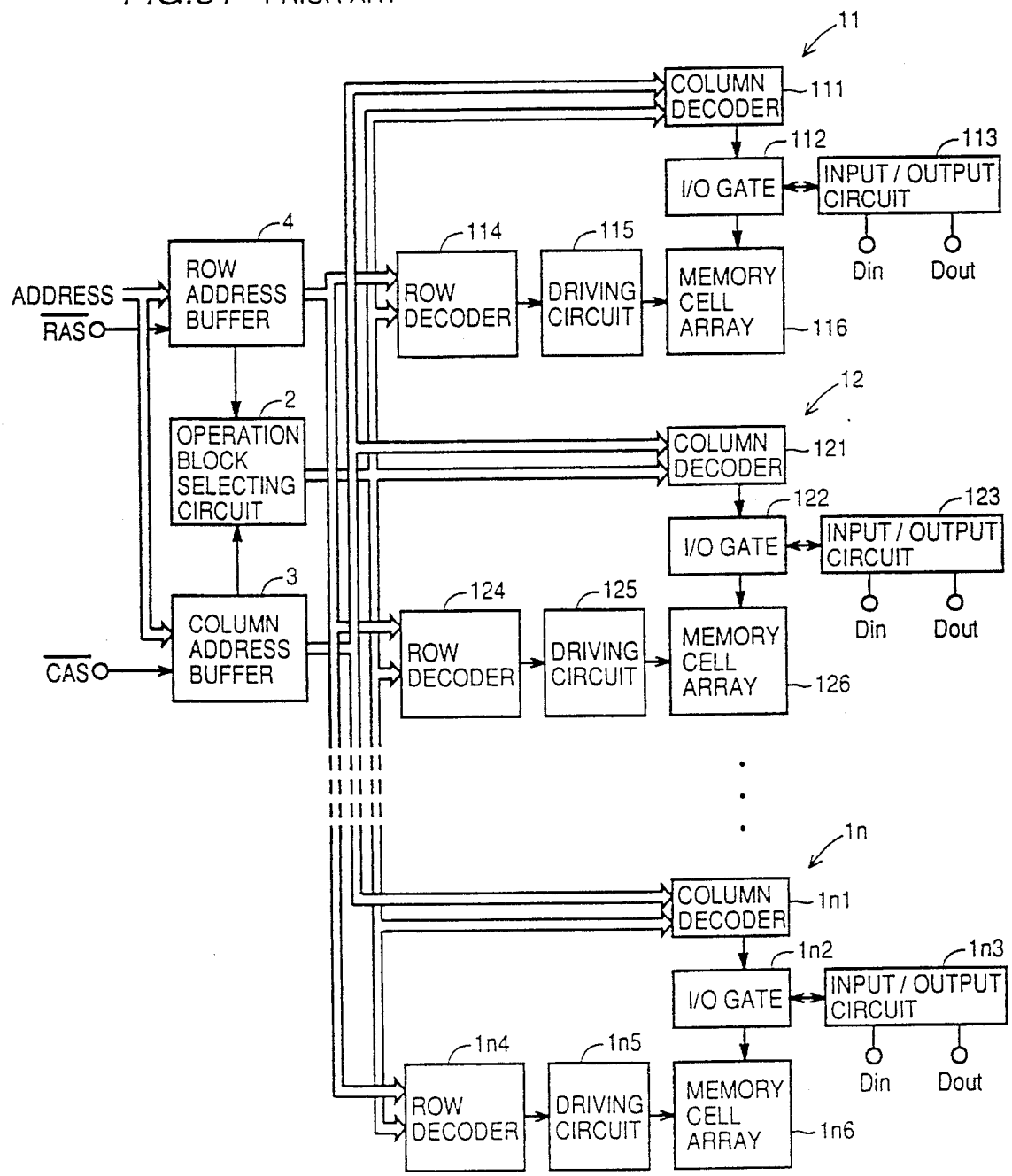
FIG. 31 is a block diagram of a conventional semiconductor memory device divided into a plurality of memory cells.
Figure 32:
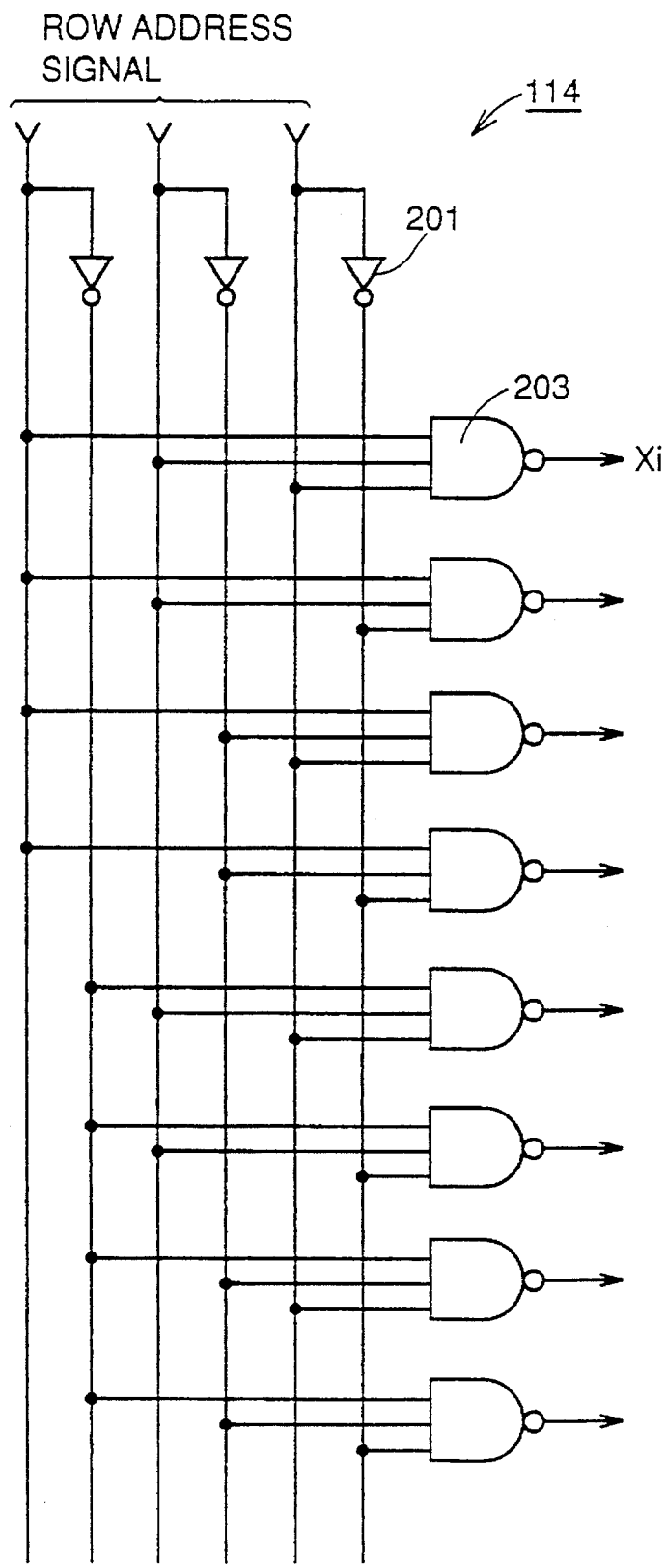
FIG. 32 is a block diagram showing one example of a row decoder shown in FIG. 31.
Figure 33:
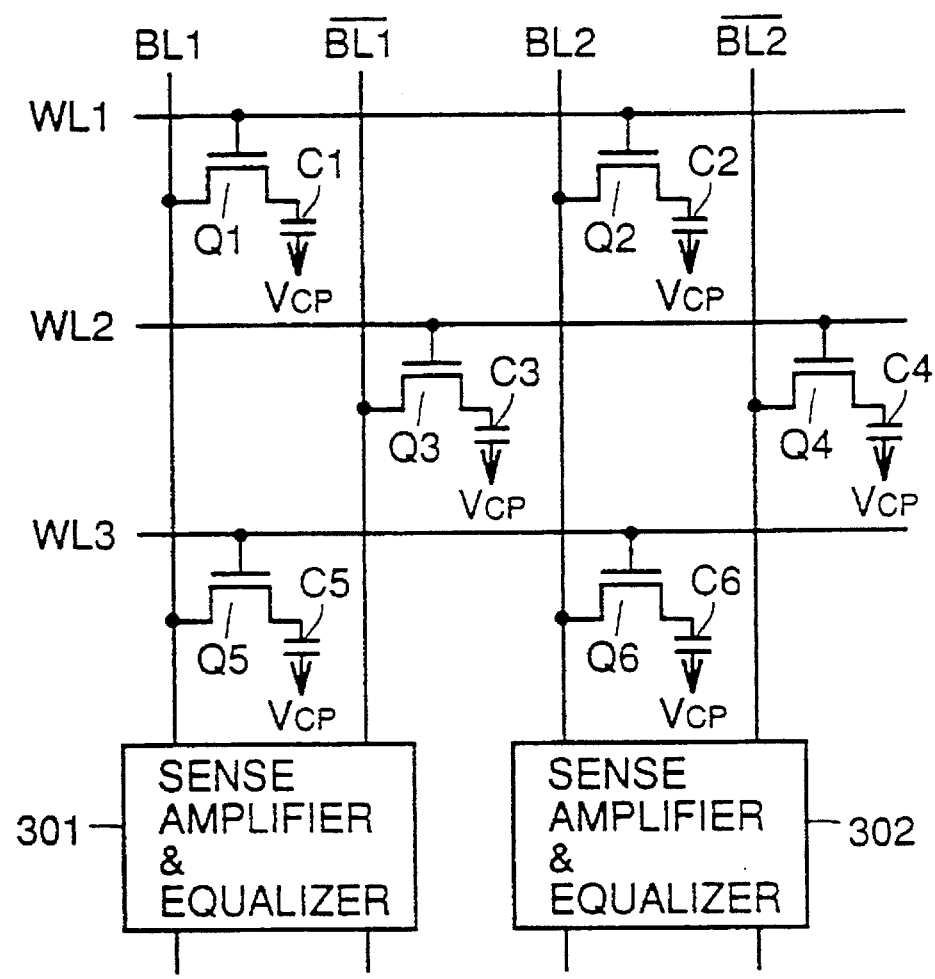
FIG. 33 is a schematic diagram of a circuit showing one example of a memory cell array shown in FIG. 31.
Figure 34:
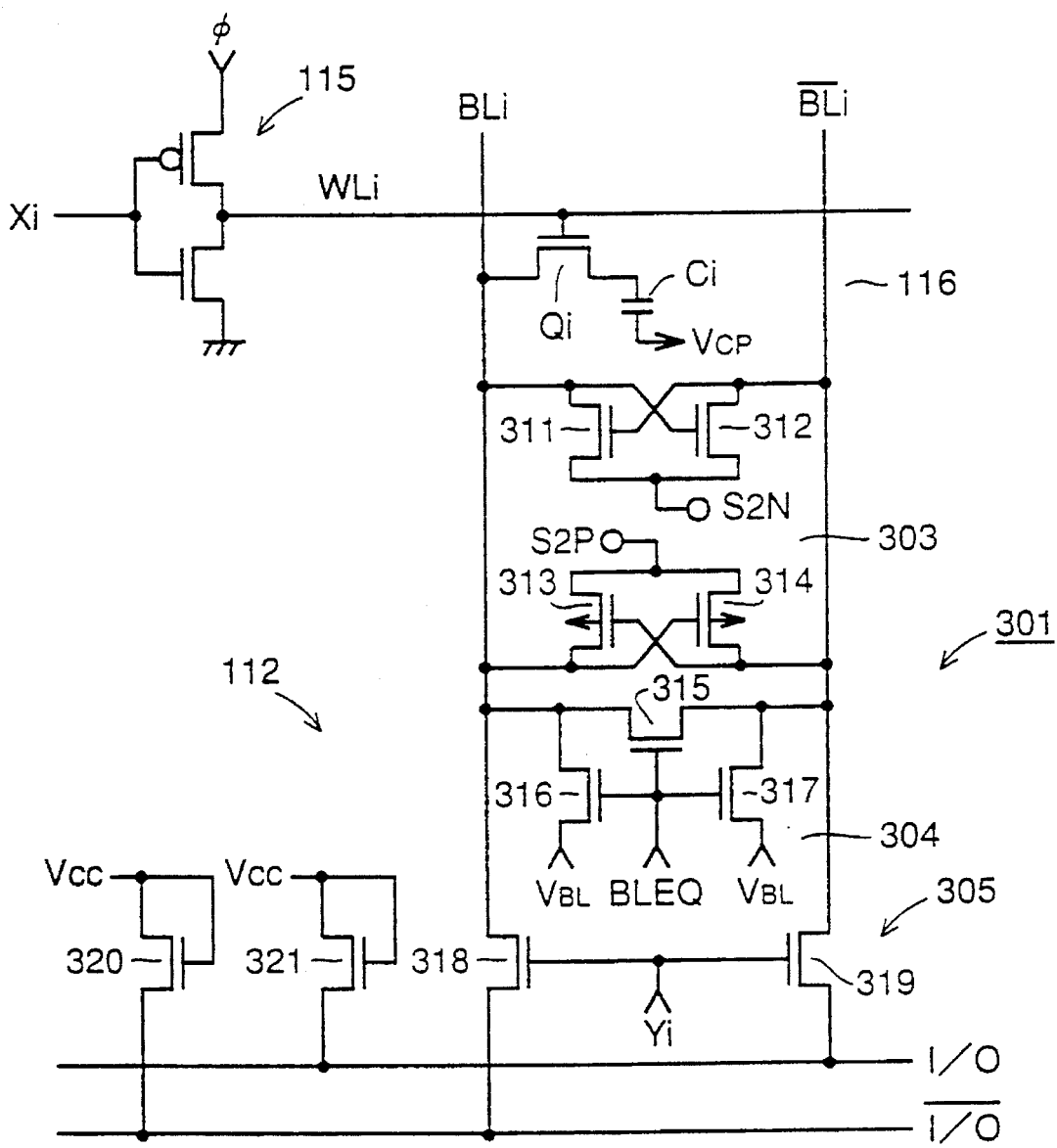
FIG. 34 is a schematic diagram of a circuit for explaining operation of transmission of data read out from a memory cell to an I/O line.
Figure 35:
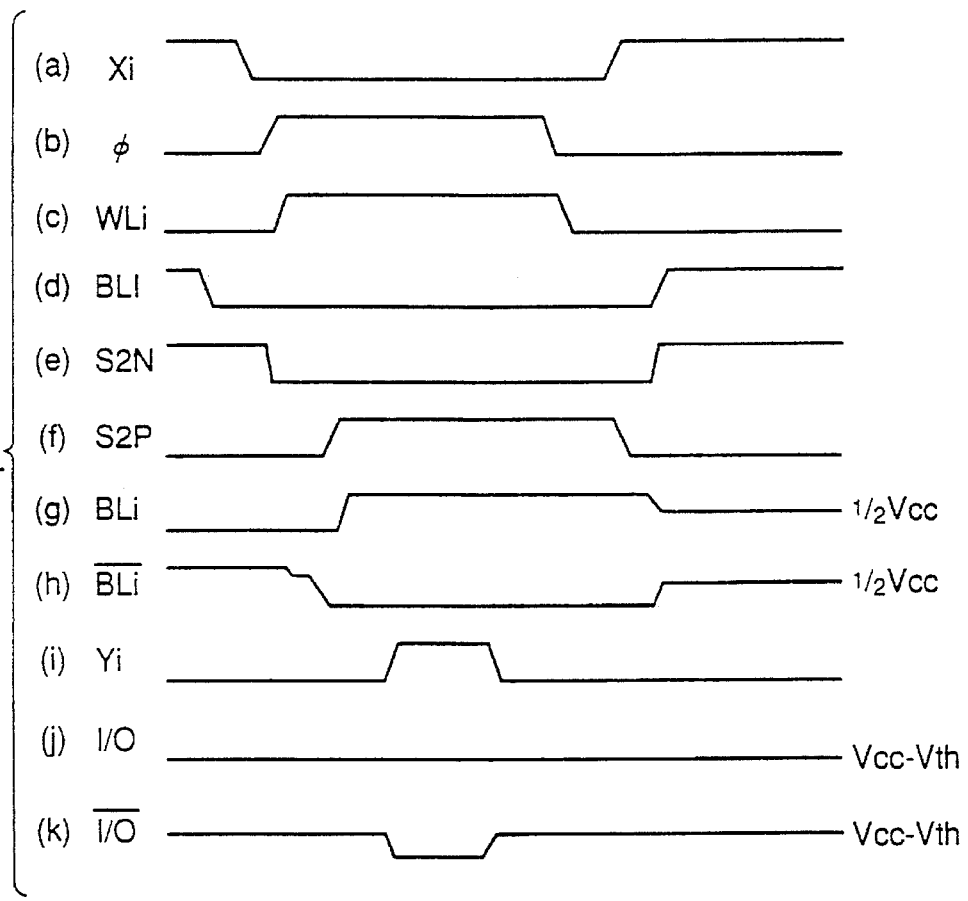
FIG. 35 is a timing chart for explaining operation of FIG. 34.
Figure 36:
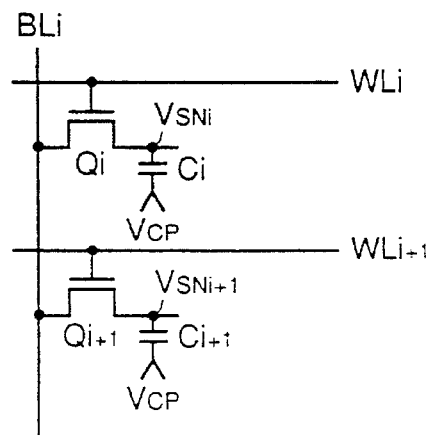
FIG. 36 is a diagram showing a part of a memory cell array shown in FIG. 33.

FIG. 30 is a diagram showing a further embodiment of the present invention. In the embodiment shown in FIG. 29, the level of the sense amplifier drive signal S2P is set to Vcc–Vth at the time of test mode detection. However, in the embodiment shown in FIG. 30, the level of the sense amplifier drive signal S2N applied to sense amplifier 21 is set to 0 V for the normal operation, and to Vth at the time of test mode detection.

The mode detect signal $\phi_T$ detected by mode detecting circuit 430 is applied to the gate of n channel transistor Q69. The source of n channel transistor Q69 is grounded. The drain of n channel transistor Q69 is connected to the gate and the drain of n channel transistor Q70, as well as to the source of n channel transistor Q68. The source of n channel transistor Q70 is grounded, and the control signal $\phi_H$ rising in response to rising of the word line is applied to the gate of n channel transistor Q68. The sense amplifier drive signal $\overline{S2N}$ is output from the drain of n channel transistor Q68.

In this embodiment, when the test mode detect signal $\phi_T$ attains an "H" level, n channel transistor Q69 is turned on, and n channel transistor Q70 is turned on. In response to rising of the word line, n channel transistor Q68 is turned on by the control signal $\phi_N$. A potential higher than 0 V by the threshold voltage Vth of n channel transistor Q68 is output as the sense amplifier drive signal S2N.

Therefore, according to this embodiment, by increasing the lower limit level written in memory cell capacitor C11 to decrease the level difference between the lower limit level and the upper limit level, it is possible to easily detect a memory cell in which data to be read to the bit line, which must be originally at an "L" level, attains an "H" level.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device including a plurality of word lines, a plurality of bit lines crossing respective word lines, a plurality of memory cell transistors each connected to one of said plurality of word lines and one of said plurality of bit lines, and a plurality of sense amplifiers connected to said plurality of bit lines, and incorporating a test circuit for determining in a test mode a memory cell transistor having an absolute value of a threshold voltage lower than a predetermined threshold voltage among said plurality of memory cell transistors, comprising:

test mode detecting means for detecting said test mode, and negative potential signal generating means responsive to detection of test mode by said test mode detecting means for applying a drive signal of a negative potential to said plurality of sense amplifiers in order that said memory cell transistor having a low threshold voltage is likely to be rendered conductive.

2. The semiconductor memory device as recited in claim 1, wherein said test mode detecting means includes means for detecting said test mode based on an address signal for designating an address of each of said plurality of memory cell transistors and an address strobe signal.

3. A semiconductor memory device having a memory cell array including plural rows of word lines, plural columns of bit line pairs, a plurality of memory cell transistors each connected to one of said plural rows of word lines and one bit line of said plural columns of bit line pairs, and memory cell capacitors connected to said respective memory cell transistors, and incorporating a test circuit for determining in a test mode a memory cell transistor having an absolute value of a threshold voltage lower than a predetermined threshold voltage among said plurality of memory cell transistors, comprising:

test mode detecting means for detecting said test mode; and control means responsive to a test mode detect signal from said test mode detecting means for controlling so that a potential level written in said memory cell capacitor is lower than in a normal operation, wherein a potential or amplitude of a bit line connected to the memory cell transistor corresponding to the memory cell capacitor to which said potential level is written is different in the test mode than in the normal operation.

4. The semiconductor memory device as recited in claim 13, further comprising:

a plurality of sense amplifiers for amplifying potential differences read to respective bit line pairs through corresponding memory cell transistors from respective memory cell capacitors; and gate transistors connected between said plurality of sense amplifiers and said plural columns of bit line pairs, wherein said control means includes potential setting means responsive to the test mode detect signal from said test mode detecting means for lowering a gate potential of said respective gate transistors than in the normal operation to lower the potential written in said memory cell capacitors.

5. The semiconductor memory device as recited in claim 4, wherein said memory cell array includes two sets of memory cell arrays disposed on both sides of said plurality of sense amplifiers, said gate transistors include first gate transistors connected between said plurality of sense amplifiers and a bit line pair of a memory cell array on one side, and second gate transistors connected between said plurality of sense amplifiers and a bit line pair of a memory cell array on the other side, said control means includes switch signal generating means for generating a switch signal for switching said first or second gate transistors, and said potential setting means includes means responsive to said test mode detect signal for lowering a potential of said switch signal generated from said switch signal generating means than in the normal operation.

6. The semiconductor memory device as recited in claim 4, wherein said potential setting means includes a control transistor responsive to said mode detect signal for providing a potential lower than a power supply voltage by its threshold voltage.

7. The semiconductor memory device as recited in claim 3, further comprising a plurality of sense amplifiers each responsive to a drive signal for amplifying potential differences read to respective bit line pairs through corresponding memory cell transistors from respective memory cell capacitors, wherein said control means includes potential setting means responsive to said test mode detect signal for changing a potential level of said drive signal compared to the normal operation and lowering a potential between said bit line pairs to lower a potential level written in said memory cell capacitors.

8. The semiconductor memory device as recited in claim 7, wherein said plurality of sense amplifiers include sense amplifiers on a high potential side responsive to a drive signal for increasing a bit line potential on the high potential side read to respective bit line pairs, and said potential setting means includes potential setting means responsive to said test mode detect signal for lowering said potential level of said drive signal than in the normal operation to lower a bit line potential on said high potential side and to lower said potential level written in said memory cell capacitor.

9. The semiconductor memory device as recited in claim 7, wherein said potential setting means includes a control transistor responsive to said test mode detect signal for providing a voltage lower than a power supply voltage by its threshold voltage.

10. The semiconductor memory device as recited in claim 7, wherein said plurality of sense amplifiers include sense amplifiers on low potential side responsive to a drive signal for lowering a bit line potential on the low potential side read to respective bit line pairs, and potential setting means responsive to said test mode detect signal for increasing said potential level of said drive signal than in the normal operation to increase a bit line potential on said low potential side and to lower said potential level written in said memory cell capacitor.

11. The semiconductor memory device as recited in claim 10, wherein said potential setting means includes a control transistor responsive to said test mode detect signal for providing a voltage higher than a ground potential by its threshold voltage.

* * * * *